(12) United States Patent
Müller-Meskamp et al.

(10) Patent No.: US 12,527,092 B2
(45) Date of Patent: Jan. 13, 2026

(54) HIGH-VOLTAGE SEMICONDUCTOR DEVICE

(71) Applicant: Infineon Technologies Austria AG, Villach (AT)

(72) Inventors: Lars Müller-Meskamp, Dresden (DE); Ralf Rudolf, Dresden (DE); Dirk Priefert, Moers (DE); Annett Winzer, Dresden (DE); Thomas Künzig, Baldham (DE); Christian Schippel, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 545 days.

(21) Appl. No.: 17/970,675

(22) Filed: Oct. 21, 2022

(65) Prior Publication Data

US 2023/0140348 A1    May 4, 2023

(30) Foreign Application Priority Data

Oct. 29, 2021  (EP) ..................................... 21205446

(51) Int. Cl.
*H10D 87/00* (2025.01)
*H01L 21/762* (2006.01)
*H10D 30/60* (2025.01)
*H10D 62/10* (2025.01)

(52) U.S. Cl.
CPC ....... *H10D 87/00* (2025.01); *H01L 21/76267* (2013.01); *H01L 21/76283* (2013.01); *H10D 30/601* (2025.01); *H10D 62/102* (2025.01)

(58) Field of Classification Search
CPC .... H10D 87/00; H10D 30/601; H10D 62/102; H10D 21/76267; H10D 21/76283
See application file for complete search history.

(56) References Cited

U.S. PATENT DOCUMENTS

| | | |
|---|---|---|
| 7,129,559 B2 * | 10/2006 | Wu ...................... H10D 62/116 257/E29.007 |
| 8,476,673 B2 | 7/2013 | Tokura et al. |
| 11,031,303 B1 * | 6/2021 | Shih ..................... H10D 84/401 |
| 2002/0043699 A1 | 4/2002 | Akiyama et al. |
| 2016/0276477 A1 | 9/2016 | Wada |
| 2021/0028166 A1 | 1/2021 | Shin |
| 2021/0082908 A1 | 3/2021 | Nakai |

(Continued)

FOREIGN PATENT DOCUMENTS

WO    2021156620 A1    8/2021

*Primary Examiner* — Richard A Booth
(74) *Attorney, Agent, or Firm* — Murphy, Bilak & Homiller, PLLC

(57) ABSTRACT

A semiconductor device includes a semiconductor layer with an inner portion, an outer portion laterally surrounding the inner portion, and a transition portion laterally surrounding the inner portion and separating the inner portion and the outer portion. A first electric element includes a first doped region formed in the inner portion and a second doped region formed in the outer portion. The first electric element is configured to at least temporarily block a voltage applied between the first doped region and the second doped region. A trench isolation structure extends from a first surface into the semiconductor layer and segments at least one of the inner portion, the transition portion, and the outer portion.

15 Claims, 19 Drawing Sheets

(56) References Cited

U.S. PATENT DOCUMENTS

2022/0130717 A1* 4/2022 Hu ..................... H01L 21/761
2023/0140348 A1* 5/2023 Müller-Meskamp .....................
   H01L 21/76283
   257/350

* cited by examiner

HIGH-VOLTAGE SEMICONDUCTOR DEVICE

TECHNICAL FIELD

Examples of the preset disclosure relate to a high-voltage semiconductor device having a transition portion for radial field distribution between an inner portion and an outer portion. In particular, the present disclosure concerns integrated circuits used in power electronics.

BACKGROUND

HV (high voltage) semiconductor devices in CMOS technology (complementary metal oxide semiconductors) form or include an interface between standard CMOS devices with input voltages below 5V on the one hand and industrial or consumer circuits operating at voltages above 30V on the other. Typical applications of such HV semiconductor devices are robotics, automotive and drivers for MEMS (micro electro mechanical systems). Typically, most of the signal processing is done at low operating voltage in a CMOS part and only the output signal interface and/or input signal interface operates at higher signal levels and/or requires higher current driving and sinking capability. An example of such a HV semiconductor device is a gate driver circuit that allows a microcontroller or digital signal processor (DSP) to efficiently turn power semiconductor switches on and off.

There is a constant need for further improving the device characteristics of power electronics devices with little additional effort and/or for reducing the chip area without sacrificing performance.

SUMMARY

Embodiments of the present disclosure relate to a semiconductor device with a transition portion for radial field distribution between an inner portion and an outer portion and integrate electric elements in the transition portion in a way that the electric elements can be easily interfaced to each other and/or to different voltage domains. Chip area can be reduced and critical interaction between the integrated electronic elements can be avoided.

To this purpose, an embodiment of the present disclosure relates to a semiconductor device with a semiconductor layer including an inner portion, an outer portion laterally surrounding the inner portion, and a transition portion laterally surrounding the inner portion and separating the inner portion and the outer portion. A first electric element includes a first doped region formed in the inner portion and a second doped region formed in the outer portion. The first electric element is configured to at least temporarily block a voltage applied between the first doped region and the second doped region. A trench isolation structure extends from a first surface into the semiconductor layer and segments at least one of the inner portion, the transition portion, and the outer portion.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and together with the description serve to explain principles of the embodiments. Further embodiments are described in the following detailed description and the claims. Features of the various illustrated embodiments may be combined with each other.

DETAILED DESCRIPTION

Figure 1A:
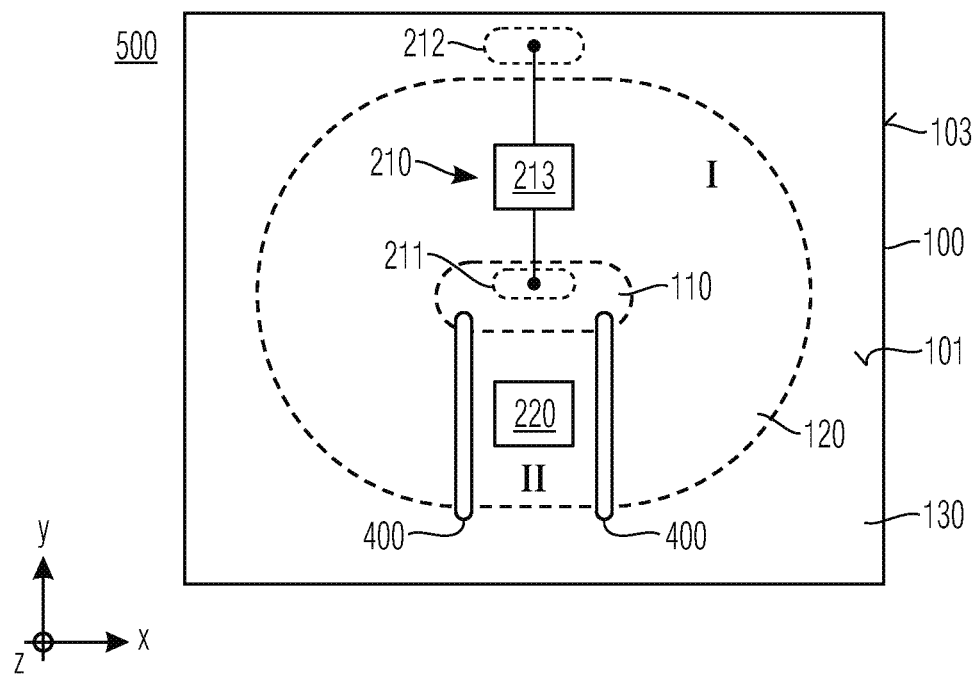
FIG. 1A is a schematic plan view of a HV semiconductor device with trench isolation structures dividing a transition portion into segments according to an embodiment.

In the following detailed description, reference is made to the accompanying drawings, which form a part hereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

The term "power semiconductor device" refers to semiconductor devices with a high voltage blocking capability of at least 30 V, for example 48 V, 100 V, 600 V, 1.6 kV, 3.3 kV or more and with a nominal on-state current or forward current of at least 200 mA, for example 1 A, 10 A or more.

The SOA (safe operating area) defines the voltage, current and environmental conditions under which a semiconductor device can be expected to operate without self-damage. The SOA is specified by published maximum values for device parameters like maximum continuous load current, maximum gate voltage and others.

MOSFETs (metal oxide semiconductor field effect transistor) are voltage controlled devices and include all types of IGFETs (insulated gate field effect transistors) with gate electrodes based on doped semiconductor material and/or metal and with gate dielectrics made of oxide and/or dielectric materials other than oxides.

An ohmic contact describes a non-rectifying electrical junction between two conductors, in particular between a semiconductor material and a metal. The ohmic contact has a linear or approximately linear current-voltage (I-V) curve in the first and third quadrant of the I-V diagram as with Ohm's law.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor layer form a semiconductor junction. Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa. Two adjoining doping regions of complementary conductivity form a pn junction.

The Figures illustrate relative doping concentrations by indicating "−" or "+" next to the doping type "n" or "p". For example, "n−" means a doping concentration which is lower than the doping concentration of an "n"-doping region while an "n+"− doping region has a higher doping concentration than an "n"− doping region. Doping regions of the same relative doping concentration do not necessarily have the same absolute doping concentration. For example, two different "n"-doping regions may have the same or different absolute doping concentrations.

According to an embodiment, a semiconductor device may include a semiconductor layer that may include an inner portion, an outer portion, and a transition portion laterally surrounding the inner portion and separating the inner portion and the outer portion. A first electric element includes a first doped region formed in the inner portion and a second doped region formed in the outer portion. The first electric element is configured to at least temporarily block a voltage applied between the first doped region and the second doped region. A trench isolation structure extends from a first surface into the semiconductor layer and segments at least one of the inner portion, the transition portion, and the outer portion.

The semiconductor device may include functional elements dedicated to different voltage domains, wherein the reference potentials of the voltage domains may fluctuate independently from each other.

Each voltage domain may include a low voltage part and/or a high voltage part. Each low voltage part includes semiconductor elements and/or integrated circuits electrically connected between network nodes with comparatively low voltage differences to a reference potential of the voltage domain. Each high voltage part includes semiconductor elements and/or integrated circuits electrically connected between network nodes with comparatively high voltage differences to the reference potential of the voltage domain.

In particular, the semiconductor device may be a HV semiconductor device with a first HV part in a first voltage domain, a second HV part in a second voltage domain and an electric separation between the first HV part and the second HV part. Each HV part is a high voltage part including at least one electric element with an input and/or output voltage level of at least 30V, e.g. at least 48V. A nominal breakdown voltage of an electric separation between the first HV part and the second HV part may be at least 100V, e.g. at least 200V.

For example, the semiconductor device may be a gate driver circuit for a half bridge including a low side switch and a high side switch, wherein the semiconductor device includes a first HV part with a first driver stage for the low side switch, a second HV part with a second driver stage for the high side switch, and a CMOS part with a CMOS interface for receiving and pre-processing input signals from a controller. A nominal breakdown voltage of an electric separation between the first HV part and the second HV part may be at least 100V, e.g. at least 200V. The CMOS part is a low voltage part including electric elements with input and output signal levels of 5V or less.

The semiconductor layer may have two substantially parallel main surfaces, which may have approximately the same shape and size. The semiconductor layer has a surface extent along two orthogonal axes (x-axis and y-axis) defining horizontal directions, and a thickness along a z-axis defining a vertical direction perpendicular to the horizontal directions. In the following, the horizontal directions are also referred to as lateral directions. The main surface at a front side of the semiconductor layer is referred to as the first surface.

The semiconductor layer may be a homogeneous semiconductor body of uniform thickness. Alternatively, the semiconductor layer may be part of an SOI (silicon-on-insulator) structure, wherein the semiconductor layer is formed on an insulator layer.

The inner portion may have a compact outline or may be ring-shaped with an opening. The outer circumference of the inner portion may include only straight and inwardly bound sections. Examples for such a compact outline are circles, ovals, ellipses, and rectangles with or without rounded corners. According to other examples, the outer circumference of the inner portion may include one or more outwardly directed bulges and/or one or more indentations. For example, the inner portion may be L-shaped or may include L-shaped parts connected to form a meandering structure. The inner portion may surround a further inner portion (central portion), wherein an inner insulator structure or an inner transition portion may separate the inner portion and the further inner portion. The inner portion may be assigned to a first voltage domain. The further inner portion may be assigned to the same or to another voltage domain.

The outer portion may extend along at least portions of the lateral edge of the semiconductor layer. For example, the outer portion may extend along the complete lateral edge. Alternatively, the outer portion may be formed partly or completely at a distance to the lateral edge. For example, a further outer portion with a second low voltage part or with a second high voltage part may surround the outer portion. The further outer portion may include an outer device portion and an insulator structure or an outer transition portion that laterally separates the outer portion and the outer device portion. The outer portion may be assigned to a second voltage domain. The further outer portion may be assigned to the same or to another voltage domain. The outer portion surrounds the transition portion completely.

The transition portion electrically separates the inner portion and the outer portion in a blocking state of the semiconductor device to the extent that the semiconductor device is operated within the SOA. In particular, the electric field effective between the inner and outer portions in the blocking state is reduced in the transition portion, with the maximum electric field strength remaining safely below the breakdown field strength of the transition portion, when the nominal blocking voltage is applied between the inner portion and the outer portion.

The transition portion electrically separates the first voltage domain and the second voltage domain. The transition portion may include lightly doped extension regions for accommodating an electric field along the radial direction.

The first electric element may include one active or passive functional unit or an electronic circuit including a plurality of active and/or passive functional units electrically connected in series and/or in parallel. A functional unit may be a circuit field plate or another field shaping structure, a semiconductor diode, a Schottky diode, an insulated gate field effect transistor, an nMOSFET (n-channel MOSFET), a PMOS (p-channel MOSFET), an LDMOS (laterally diffused MOSFET), an LIGBT (lateral insulated gate bipolar transistor), an ESD protection device, a snubber element, a sense element for sensing temperature, a sense element for detecting an overcurrent condition, a capacitor, or a resistor, by way of example. An electric element with more than one functional unit may be a diode chain with several semiconductor diodes electrically connected in series.

In at least one operational state of the semiconductor device, the first electric element blocks a high voltage applied between the outer portion and the inner portion. The high voltage may be at least 48V, at least 60V, at least 600V, at least 650V, at least 800V or at least 1200V, by way of example. In another operational state a current may flow through the first electric element between the inner portion and the outer portion.

The trench isolation structure extends from the first surface at the front side of the semiconductor layer into the semiconductor portion. The trench isolation structure may be a contiguous one-part structure or may be a multi-part structure including two or more laterally separated parts.

The trench isolation structure may have approximately vertical sidewalls. For example, the sidewalls of the trench isolation structure may be vertical or a tilt angle between each sidewall and the z-axis is less than 15 degree.

A vertical extension of the trench isolation structure may be greater than the vertical extension of each implanted and/or diffused doped region extending from the first surface at the front side of the semiconductor layer into the transition portion, the inner portion and the outer portion.

A vertical extension of the trench isolation structure is related to the voltage blocking capability of the semiconductor device. For example, the vertical extension may be in a range from 0.03 μm/V*VBR to 0.1 μm/V*VBR, wherein VBR is the nominal breakdown voltage of the semiconductor device.

The trench isolation structure may include one or more layers of dielectric materials, e.g. thermal silicon oxide, deposited silicon oxide, silicon nitride, silicon oxynitride, doped or undoped silicate glass and/or a dielectric polymer. Alternatively, one or more conductive layers the trench isolation structure may include one or more dielectric liners and. The trench isolation structure may be completely filled with solid material or may include an intentional air gap.

The trench isolation structure segments at least one of the inner portion, the transition portion, and the outer portion, wherein the trench isolation structures may divide the inner portion into inner sectors or inner segments and/or the transition portion into transition segments, and/or the outer portion into outer segments.

Sectors or segments of the inner portion, segments of the transition portion, and segments of the outer portion may be aligned to each other. In particular, one inner sector, one transition segment and one outer segment may complement each other to a contiguous three-zone sector extending radially from an interior of the inner portion through the transition portion into the outer portion.

For example, a trench isolation structure may extend through the inner portion and may divide the inner portion into two or more separated inner sectors. Corresponding segments of the transition portion may be defined by junction isolation regions, a further trench isolation structure or a combination of both.

According to another example, the trench isolation structure may be formed in the transition portion and/or the outer portion and may include two or more laterally separated trench isolation parts. Each of the two or more trench isolation parts may extend from the inner portion to the outer portion, wherein the trench isolation parts may divide the transition portion into two or more laterally separated transition segments, and wherein each transition segment extends between two neighboring trench isolation parts from the inner portion to the outer portion.

According to a further example, two or more trench isolation parts may extend from the transition portion into the outer portion and may divide the outer portion into two or more laterally separated outer segments. Corresponding segments of the transition portion may be defined by junction isolation regions, shallow trench isolations, trench isolation parts or a combination of both.

The trench isolation structure facilitates integration of several functional elements within one radial superstructure ("radial device") including a first voltage domain, a second voltage domain and an electric separation between the first voltage domain and the second voltage domain, wherein the functional elements may share one or more electric potentials.

For example, the first electric element may be formed in a first three-zone sector including a first inner sector or first inner segment, a first transition segment in contact with the first inner sector or segment and a first outer segment in contact with the first transition segment A second electric element may be formed in a second three-zone sector including a second inner sector, a second transition segment in contact with the second inner sector and a second outer segment in contact with the second transition segment.

Several electric elements may be integrated in the same superstructure, wherein the active chip area can be reduced. The electric elements can share the same high/low potentials or may use slightly different potentials. The trench isolation structures may reduce crosscurrent and/or crosstalk between electric elements formed in different three-zone sectors.

In addition, the electric elements formed in the radial device share the same radial field distribution between a first and a second voltage domain and can therefore be interfaced to both voltage domains at low effort. The electric elements can be operated independently from the other electric elements in the same radial device. One radial device may integrate small devices like level shift transistors and large devices like a bootstrap diode such that the active chip area can be efficiently used.

According to an embodiment, the semiconductor device may further include an insulator layer, wherein the semiconductor layer is formed on the insulator layer and wherein the trench isolation structure extends from a first surface at a front side of the semiconductor layer to or into the insulator layer.

The semiconductor layer and the insulator layer may form or may be part of an SOI structure.

The semiconductor layer is a layer of uniform thickness, wherein a thickness of the semiconductor layer along the vertical direction may be in a range from 50 nm to 200 µm, e.g. at least 20 µm. The material of the semiconductor layer is a single-crystalline semiconductor, e.g. silicon.

The insulator layer may be a homogenous layer or may include two or more vertically stacked sub-layers of different composition and/or structure. For example, the insulator layer may include a silicon oxide layer, a silicon nitride layer, and/or a siliconoxynitride layer. The insulator layer may have a vertical extension in a range from 200 nm to 20 µm. A voltage blocking capability of the insulator layer may be in a range from 200V to 1500V, e.g., about 300V.

The semiconductor device may be formed with no further single-crystalline semiconductor material at a side of the insulator layer opposite to the semiconductor layer. In particular, the semiconductor device is formed without any layer on the side of the insulator layer opposite to the semiconductor layer.

According to some examples, the insulator layer may separate the semiconductor layer from a non-insulating base. The non-insulating base may be or may include a semiconductor substrate. The semiconductor substrate may be homogenously doped or may include doped regions extending from the interface with the insulator layer into the semiconductor substrate. Alternatively, a layer or a layer stack that does not include an active semiconductor material can be formed on the side of the insulator layer opposite to the semiconductor layer, e.g. a layer or layer stack that includes a semi-metal layer like a polycrystalline silicon layer and/or a metal layer. Alternatively, the non-insulating base is free of semiconducting materials. For example, the non-insulating base may include or consist of a metal plate and/or a metal layer.

The insulator layer and the semiconductor layer are vertically stacked on the non-insulating base along the z-axis in this order.

For a non-insulating base without single-crystalline semiconductor material, a vertical extension of the insulator layer may be in a range from 500 nm to 25 µm and the thickness of the semiconductor layer may be in a range from 500 nm to 200 µm.

For a non-insulating base including single-crystalline semiconductor material, a vertical extension of the insulator layer may be in a range from 50 nm to 500 nm and the thickness of the semiconductor layer may be in a range from 200 nm to 3 µm.

In particular, a trench isolation structure with two laterally separated parts extending from the first surface down to the insulator layer and defining, between the two laterally separated parts, a first inner sector and/or a first transition segment, and/or a first outer segment efficiently separates an electric element formed within the first inner sector and/or the first transition segment and/or the first outer segment from electric elements formed outside the first inner sector, the first transition segment, and the first outer segment.

The trench isolation structure and portions of the insulator layer below the first inner sector and/or the first transition segment, and/or the first outer segment form a separating structure enclosing a part of the semiconductor layer in the respective inner portion, transition portion and/or outer portion on at least three sides. The separation structure may reduce interactions and crosscurrents between neighboring electric elements formed in different three-zone sectors.

According to an embodiment, the first electric element may include a diode, wherein the first doped region forms at least part of a first electrode region of the diode, and wherein the second doped region forms at least part of a second electrode region of the diode, and wherein the first and second electrode region form a pn junction.

The pn junction may be formed in the transition portion. In particular, the first electrode region may include a heavily doped first contact region in the inner portion and a lightly doped first extension region extending from the heavily doped first contact region into direction of the second electrode region and/or the second electrode region may include a heavily doped second contact region in the outer portion and a lightly doped second extension region extending from the heavily doped second contact region into direction of the first electrode region.

The first doped region may be n doped and may form the cathode region and the second doped region may be p doped and may form the anode region of the diode. Alternatively, the second doped region may be n doped and may form the cathode region and the first doped region may be p doped and may form the anode region of the diode.

The trench isolation structures may suppress a leakage current from neighboring sectors and/or may suppress an adverse impact of the diode forward current on neighboring structures, e.g. a possible activation of a parasitic bipolar transistor structure.

According to another embodiment, the first electric element may include an insulated gate field effect transistor, wherein the first doped region forms at least part of a first source/drain region, wherein the second doped region forms at least part of a second source/drain region, and wherein in an on-state of the insulated gate field effect transistor a charge carrier channel connects the first and second source/drain regions.

The insulated gate field effect transistor may further include a lightly doped drain extension region and a body region. The drain extension region forms a unipolar junction with one of the first and second source/drain regions. The body region separates the drain extension region from the other one of the first and second source/drain regions.

For example, the first electric element is an enhancement-type MOSFET and the body region has a conductivity type opposite to the conductivity type of the first and second source/drain regions. The first doped region may form the complete first source/drain region. The second doped region may form the complete second source/drain region. The first and second doped regions may be n doped. Alternatively, the first and second doped regions may be p doped.

The trench isolation structures may suppress a leakage current from neighboring sectors and/or may suppress an adverse impact of the transistor on-state current on neighboring structures.

According to an embodiment, the trench isolation structure may laterally extend through the inner portion.

In particular, the trench isolation structure may divide the inner portion into two or more inner sectors or inner segments. For example, the trench isolation structure in the inner portion may include two or more straight sections structurally connected at lateral ends oriented to a lateral center of the inner portions. Each lateral end averted from the lateral center may extend up to or into the transition portion. The inner sectors may have different size.

The inner sectors can be electrically connected to the same potential or to different electrical potentials. Doped regions and conductive structures formed in neighboring inner sectors can be to a high degree decoupled from each other, e.g. as regards parasitic crosscurrents and/or parasitic capacitive interaction.

According to an embodiment, the trench isolation structure may laterally extend from at least the inner portion to at least the outer portion.

In particular, the trench isolation structure may include at least two laterally separated trench isolation parts, wherein each trench isolation parts may extend from the inner portion to the outer portion. Alternatively, each trench isolation part may extend into the inner portion and/or into the outer portion.

The trench isolation s parts may divide the transition portion into two or more transition segments. The transmission segments may have different size.

The transition segments can have different electrical potentials. Doped regions and conductive structures formed in neighboring transition segments are to a high degree decoupled from each other.

According to an embodiment, the trench isolation structure may include a plurality of short trenches formed along a straight trench line connecting the inner portion and the outer portion.

Each trench line with short trenches forms one trench isolation part. The length of the short trenches along the straight trench line connecting the inner portion and the outer portion may be smaller than a width of the transition portion along the same trench line. At least two short trenches may be formed along the same trench line. The short trenches are laterally separated along the trench line. A distance between two neighboring short trenches on the same trench line is large enough such that neighboring short trenches can be formed without damaging the semiconductor material between neighboring short trenches. The short trenches may have approximately uniform width and uniform length.

The short trenches can be combined with a conductive material for forming at least a part of the trench isolation structures. In case of the trench isolation structures including a conductive material, the gaps between the short trenches along the same trench line may interrupt a low conductive path between an inner end of the trench isolation structure oriented to the inner portion and an outer end of the trench isolation structure oriented to the outer portion.

According to an embodiment, the trench isolation structure may include a plurality of short trenches formed along at least two adjacent straight trench lines, wherein each of the at least two adjacent straight trench lines at least extends from the inner portion to the outer portion.

In particular, a mean distance between two neighboring trench lines may be smaller than a mean length of the short trenches along the respective trench line, e.g. equal to or smaller than a width of the short trenches orthogonal to the trench line. The at least two trench lines may be parallel lines and form one trench isolation part.

The short trenches in neighboring trench lines may be shifted to each other along the trench line, e.g. by half the center-to-center distance between neighboring short trenches along the same line. Short trenches along a first trench line may overlap with gaps between short trenches along a second trench line and short trenches along the second trench line may overlap with gaps between short trenches along the first trench line, wherein the separation effect is improved.

According to an embodiment, the trench isolation structure may include a continuous trench isolation part at least extending from the inner portion to the outer portion.

For example, the continuous trench may extend from the interface between the inner portion and the transition portion to the interface between the transition portion and the outer portion. Alternatively, the continuous trench isolation part may extend into the outer portion and/or into the inner portion.

In particular, two trench isolation parts laterally defining a transition segment and extending from the first surface down to the insulator layer can decouple electric elements formed in different transition segments to a high degree. Two trench isolation parts and a portion of the insulator layer below the transition segment between the two trench isolation parts form a dielectric box enclosing the transition segment on at least three sides. The dielectric box reduces capacitive interaction and crosscurrents between neighboring functional elements formed in different transition segments.

According to an embodiment, the trench isolation structure may include a continuous, meandering trench isolation part at least extending from the inner portion to the outer portion.

For example, the meandering trench isolation part may extend from the interface between the inner portion and the transition portion to the interface between the transition portion and the outer portion. Alternatively, the meandering trench isolation part may extend into the outer portion and/or into the inner portion.

In particular, the meandering trench isolation part may define a line of pockets in the transition portion, wherein the meandering trench isolation part confines each pocket on three lateral sides. The pockets may mitigate issues with interface leakage.

In each pocket, a low voltage device, e.g. a resistive element or a diode, a transistor, or a part of a low voltage device may be formed. A conductive structure in the pocket, e.g. a doped region, may be electrically connected with a field plate and/or field ring formed in the transition portion to improve the high voltage behavior. The field plate and/or the field ring may be formed on the front side of the semiconductor layer The meandering trench isolation part may facilitate separation and decoupling of electric elements electrically connected in series between a doped region or conductive structure formed in the inner portion and a doped region or conductive structure formed in the outer portion.

In particular, the first electric element may include a diode chain with a plurality of diodes electrically connected in series between the first doped region and the second doped region. The cathode region of a first diode and the anode region of a second diode may be electrically connected with each other and may be formed in the same pocket. Alternatively, each pocket may include the cathode region and the anode region of the same diode.

According to an embodiment, the trench isolation structure may include a continuous straight trench isolation part at least extending from the inner portion to the outer portion.

In particular, at least two trench isolation parts may be continuous straight trench isolation parts. For example, each of the straight trench isolation parts may extend from the interface between the inner portion and the transition portion to the interface between the transition portion and the outer portion. Alternatively, each straight trench isolation part may extend into the outer portion and/or into the inner portion.

According to an embodiment, the trench isolation structure may include at least one transverse trench part running transversely to the continuous straight trench isolation part, wherein the transverse trench part is in contact with the continuous straight trench isolation part.

For example, the at least one transverse trench part may run at right angle to the straight trench isolation part. A number of transverse trench parts in contact with the same straight trench isolation part may define a line of pockets between them, wherein the straight trench isolation part and the transverse trench parts confine each pocket on two or three lateral sides. In each pocket, a low voltage device, e.g. a resistive element or a diode, a transistor, or a part of a low voltage device may be formed.

In particular, the transverse trench parts may facilitate separation and decoupling of electric elements electrically connected in series between a doped region or conductive structure formed in the inner portion and a doped region or conductive structure formed in the outer portion.

According to an embodiment, the trench isolation structure may include a pair of continuous straight trench isolation parts at least extending from the inner portion to the outer portion, and at least one transverse trench part running transversely to the continuous straight trench isolation parts from a first one to a second one of the pair of continuous straight trench isolation parts.

For example, the at least one transverse trench part may run at right angle to the straight trench isolation parts. In particular, the pair of straight trench isolation parts may form the rails and the transverse trench parts may form the rungs of an isolation trench ladder, wherein the rails and rungs of the isolation trench ladder confine isolated islands in the transition portion on four lateral sides. In the isolated islands, additional electric elements may be formed such as diodes MOSFETs and/or resistors. Any additional element in an isolated island can be electrically connected with a conductive structure and/or further electric element to allow a better control of elements in the transition portion. For example, the additional elements include field plates, wherein diodes connected to the field plates allow fast charging and/or discharging of the field plates.

According to an embodiment, the semiconductor device may further include an outer trench structure between a first part of the outer portion and a second part of the outer portion. The first part of the outer portion may include the second doped region of the first electric element. The outer trench structure reduces unintended charge carrier flow to and/or from the second doped region of the first electric element.

In addition, the trench isolation structure may include one, two or more trench isolation parts, wherein each trench isolation part may be in contact with the first part of the outer portion in angular direction. Each trench isolation part may be formed between the first part of the outer portion and the second part of the outer portion and/or between the first part of the outer portion and the transition portion. Each trench isolation part may be in contact with the outer trench structure. Each trench isolation part may extend from the outer trench structure inwardly in radial direction to or into the transition portion.

In particular, the outer trench structure and two neighboring trench isolation parts formed in contact with the outer trench structure may define an outer segment of the outer portion, wherein the trench isolation parts, the outer trench structure and portions of the insulator layer below the outer segment form a separating structure enclosing the outer segment on at least four sides. The separating structure reduces capacitive interaction and crosscurrents between neighboring electric elements formed in different outer segments.

According to an embodiment, the transition portion 120 may include at least two lightly doped extension regions and at least two junction isolation regions. Each junction isolation region laterally separates neighboring ones of the lightly doped extension regions, wherein the lightly doped extension regions and the junction isolation regions form pn junctions or unipolar junctions.

For example, the extension regions are n conductive and the junction isolation regions are n conductive or p conductive. According to another example, the extension regions are p conductive and the junction isolation regions are n conductive or p conductive. Alternatively, the junction isolation regions may include differently doped subregions, e.g. subsegments whose conductivity type alternate along the angular direction.

The lightly doped extension regions may include drain extensions of LDMOS transistors or diode electrode extension regions, by way of example. Each lightly doped extension region and each junction isolation region may be formed in a segment of the transition portion.

In addition, the transition portion may include one or more junction region trenches, wherein each junction region trench separates one of the junction isolation regions from the outer portion. Each junction region trench may be a segment of a closed trench ring.

Junction isolation regions may be combined with trench isolation parts, wherein a trench isolation part may form a radial projection of a pn junction or an unipolar junction between a junction isolation region and a lightly doped extension region.

Another embodiment may refer to a high voltage semiconductor device. The high voltage semiconductor device may include a semiconductor layer, a first electric element, and a trench isolation structure. The semiconductor layer may include an inner portion, an outer portion, and a transition portion laterally surrounding the inner portion and separating the inner portion and the outer portion. The first electric element includes a first doped region formed in the inner portion and a second doped region formed in the outer portion. The first electric element is configured to at least temporarily block a voltage applied between the first doped region and the second doped region. The trench isolation structure extends from a first surface into the semiconductor layer. The trench isolation structure includes at least two laterally separated trench isolation parts segmenting at least one of the inner portion, the transition portion and the outer portion.

The high voltage semiconductor device may be a half bridge gate driver circuit with a first HV part in a first voltage domain, a second HV part in a second voltage domain, and with a CMOS part. The CMOS part includes an input circuit for receiving and preprocessing low-voltage level input signals. Each HV part includes a driver stage, e.g. a push-pull stage or inverter stage with two MOSFETs electrically connected in series between a high voltage line and a reference voltage line.

Figure 1B:
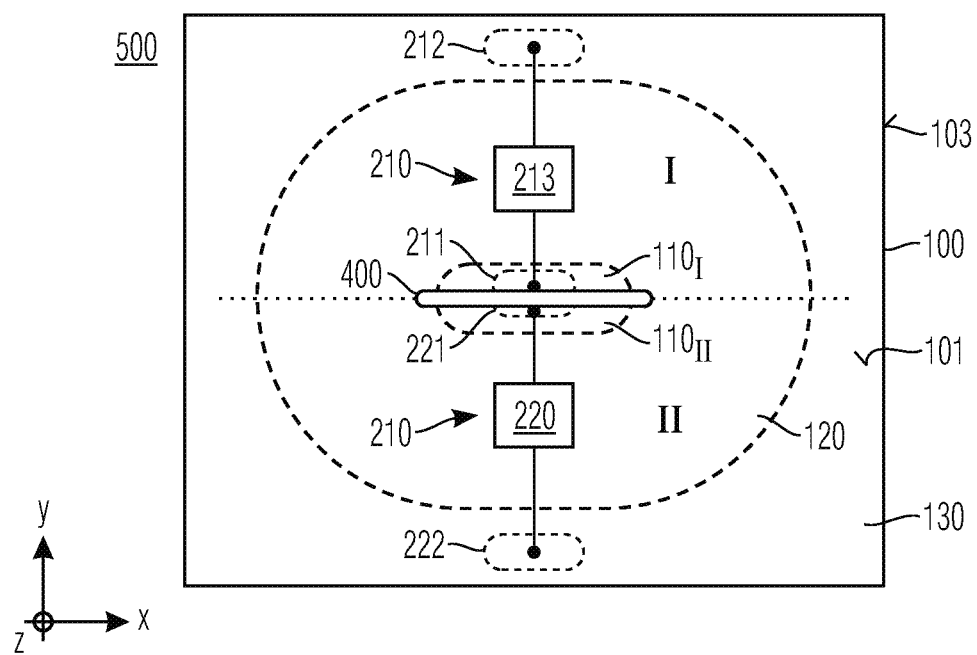
FIG. 1B is a schematic plan view of a HV semiconductor device with a trench isolation structure dividing an inner portion into sectors according to another embodiment.
Figure 1C:
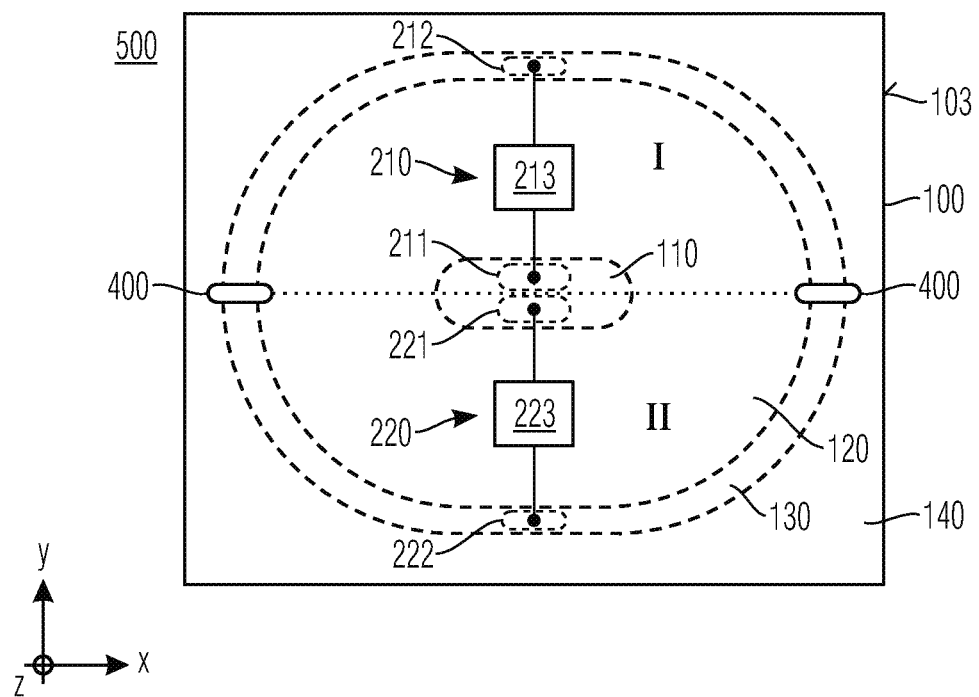
FIG. 1C is a schematic plan view of a HV semiconductor device with trench isolation structures dividing an outer portion into segments according to a further embodiment.

Each of FIG. 1A, FIG. 1B and FIG. 1C shows a first surface 101 of a semiconductor layer 100 on the front side of a semiconductor device 500. The first surface 101 is planar and extends along two orthogonal axes (x-axis and y-axis) defining horizontal directions. The semiconductor layer 100 has a thickness along a z-axis defining a vertical direction perpendicular to the horizontal directions. In the following, the horizontal directions are also referred to as lateral directions.

The semiconductor layer 100 may be a homogeneous semiconductor body of uniform thickness, wherein a thickness of the semiconductor layer 100 along the z-axis may be in a range from 50 µm to 775 µm. Alternatively, the semiconductor layer 100 may be part of an SOI (silicon-on-insulator) structure, wherein the semiconductor layer 100 is formed on an insulator layer. The material of the semiconductor layer 100 is a single-crystalline elemental semiconductor or compound semiconductor, for example silicon (Si) or silicon germanium (Site).

The semiconductor layer 100 includes an inner portion 110, a transition portion 120 laterally surrounding the inner portion 110, and an outer portion 130 laterally surrounding the transition portion 120. The inner portion corresponds to a first voltage domain. The outer portion corresponds to a second voltage domain. The transition portion 120 separates the inner portion 110 and the outer portion 130 and electrically separates the first voltage domain and the second voltage domain. The outer portion 130 separates the transition portion 120 from an outer edge 103 of the semiconductor layer 100. The inner portion 110 forms an oval. The transition portion 120 forms a ring of uniform lateral extension around the inner portion 110.

The inner portion 110 and the transition portion 120 form an inner semiconductor junction, which may be a unipolar junction or a pn junction. The transition portion 120 and the outer portion 130 form an outer semiconductor junction, which may be a unipolar junction or a pn junction.

In a blocking state of the semiconductor device, the blocking voltage drops across the transition portion 120 between a conductive structure in the outer portion 130 and a conductive structure in the inner portion 110. The transition portion 120 reduces the electric field effective between the inner portion 110 and the outer portion 130, wherein a lateral extension of the transition portion 120 and a dopant concentration in the transition portion 120 are selected such that for the nominal blocking voltage the maximum electric field strength is safely below the breakdown field strength of the transition portion 120.

A trench isolation structure 400 extends from the first surface 101 into the semiconductor layer 100 and segments at least one of the inner portion 110, the transition portion 120, and the outer portion 130. The trench isolation structure 400 alone or the trench isolation structure 400 in combination with shallow isolation structures and/or junction isolation regions divide the inner portion 110, the transition portion 120 and the outer portion 130 into two three-zone sectors I, II.

In particular, the trench isolation structure 400 segments at least one of the inner portion 110, the transition portion 120, and the outer portion 130, wherein the trench isolation structure 400 may divide the inner portion 110 into inner sectors and/or the transition portion 120 into transition segments, and/or the outer portion 130 into outer segments.

A first three-zone sector I includes a first electric element 210 with a first doped region 211 formed in the inner portion 110, a second doped region 212 formed in the outer portion 130, and a first functional part 213, which may be at least partly formed in the transition portion 120. A second three-zone sector II includes a second electric element 220.

In case the semiconductor device 500 is a half bridge gate driver, the first electric element 210 may be a bootstrap diode for supplying electric power to at least one of the HV parts formed in the inner portion 110 and the outer portion 120. The second electric element 220 may include a level-shift transistor to transfer signal levels of control signals for one or more of the HV parts.

In FIG. 1A, the trench isolation structure 400 includes two laterally separated trench isolation parts. Each of the two trench isolation parts extends from the inner portion 110 to the outer portion 130. The two trench isolation parts divide the transition portion 120 into two laterally separated transition segments. Each transition segment is part of one of the two three-zone sectors I, II.

The second electric element 220 may be completely formed in the transition segment of the second three-zone section II. According to other examples (not illustrated), the second electric element 220 may include a doped region in one of the inner sector and the outer segment or doped regions in both the inner sector and outer segment of the second three-zone section II.

In FIG. 1B the trench isolation structure 400 extends through the inner portion 110 and divides the inner portion 110 into two separated inner sectors 110-I, 110-II, wherein each inner sector 110-I, 110-II forms part of one of the two three-zone sectors I, II. The second three-zone sector II includes a second electric element 220 with a first doped region 221 formed in the second inner sector 110-II, a second doped region 222 formed in the outer portion 130, and a second functional part 223.

FIG. 1C shows a semiconductor layer 100 with a further outer portion 140 surrounding the outer portion 130. The trench isolation structure 400 includes two laterally separated trench isolation parts. Each of the two trench isolation parts laterally extends from the transition portion 120 through the outer portion 130 into the further outer portion 140. The two trench isolation parts divide the outer portion 130 into two laterally separated outer segments. Each outer segment is part of one of the two three-zone sectors I, II.

Each of the trench isolation structures 400 of FIG. 1A, FIG. 1B and FIG. 1C can be combined with any of the other trench isolation structures 400 in FIG. 1A, 1B, 1C.

Figure 2:
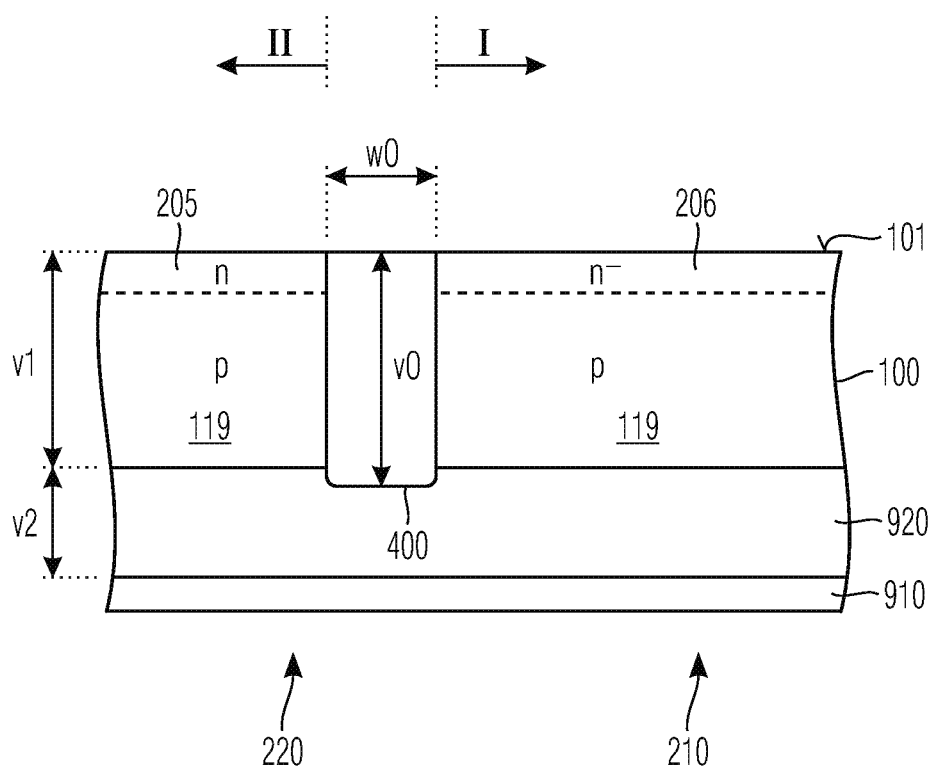
FIG. 2 is a schematic vertical cross-sectional view of a portion of a semiconductor device with a trench isolation structures according to an embodiment.

In FIG. 2, the semiconductor layer 100 is part of an SOI (semiconductor-on-insulator) structure. An insulator layer 920 is formed on a non-insulating base 910. The semiconductor layer 100 is formed on the insulator layer 920. The non-insulating base 910, the insulator layer 920 and the semiconductor layer 100 are vertically stacked on each other and form the SOI structure.

The non-insulating base 910 may be or may include a semiconductor substrate, wherein the semiconductor substrate may be homogenously doped or may include doped regions extending from the interface with the insulator layer 920 into the semiconductor substrate. Alternatively or in addition, the non-insulating base 910 may include a metal plate or a metal layer.

The insulator layer 920 separates the semiconductor layer 100 from the non-insulating base 910. The insulator layer 920 has a uniform vertical extension v2 and may be a homogenous layer, e.g. a silicon oxide layer. Alternatively, the insulator layer 920 may include two or more vertically stacked sub-layers of different composition and/or structure. The insulator layer 920 may have a vertical extension in a range from 200 nm to 800 nm, e.g., from 350 nm to 450 nm. Alternatively, for example in the absence of the non-insulating base 910, the insulator layer 920 may have a vertical extension in a range from 1 μm to 20 μm, e.g., from 1 μm to 10 μm. A voltage blocking capability of the insulator layer 920 may be in a range from 200V to 1500V, e.g., about 300V.

The semiconductor layer 100 may be a layer of uniform thickness, wherein a vertical extension v1 of the semiconductor layer 100 along the z-axis may be in a range from 50 nm to 20 μm, e.g. in a range from 100 nm to 1 μm.

In particular, FIG. 2 refers to a semiconductor device with PDSOI (partially depleted SOU electric elements, wherein doped regions 205, 206 of the electric elements are formed as doped wells extending from the first surface 101 at the front side of the semiconductor layer 100 into an upper portion of the semiconductor layer 100. A bulk portion 119 of the semiconductor layer 100 separates the doped regions 205, 206 from the insulator layer 920. A vertical extension v1 of the semiconductor layer 100 is in a range from 10 μm to 220 μm, for example in a range from 20 μm to 140 μm.

According to another example (not illustrated), the semiconductor device includes FDSOI (fully depleted SOU electric elements, wherein doped regions 205, 206 of the electric elements extend from the first surface 101 down to the insulator layer 920. A vertical extension v1 of the semiconductor layer 100 may be in a range from 20 nm to 500 nm.

The trench isolation structure 400 has vertical sidewalls. A vertical extension v0 of the trench isolation structure 400 is equal to or greater than the vertical extension of the doped regions 205, 206 extending from the first surface 101 into the transition portion, the inner portion and/or the outer portion of the semiconductor layer 100.

In particular, FIG. 2 shows a trench isolation structure 400 with a vertical extension v0 equal to or greater than the vertical extension v1 of the semiconductor layer 100. Alternatively (not illustrated), the trench isolation structure 400 ends in the bulk portion 119 between a lower edge of the doped regions 205, 206 and the insulator layer 920.

Figure 3A:
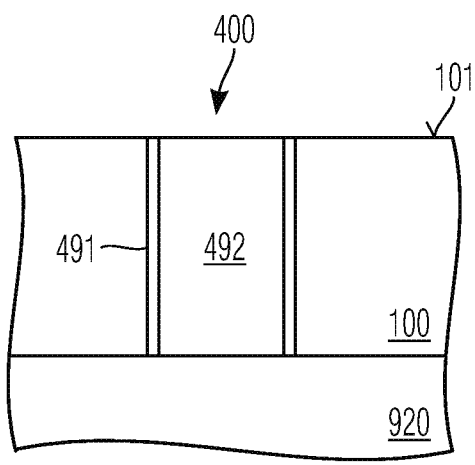
FIG. 3A to FIG. 3C are schematic vertical cross-sectional views of a trench isolation structure according to further embodiments.

In FIG. 3A, the trench isolation structure 400 includes a first dielectric layer 491 formed along the sidewalls and a dielectric fill material 492. The first dielectric layer 491 may be thermally grown oxide. The dielectric fill material 492 may include one or more layers of other dielectric materials deposited in a trench, e.g. deposited silicon oxide, silicon nitride, silicon oxynitride, doped or undoped silicate glass and/or a dielectric polymer.

Figure 3B:
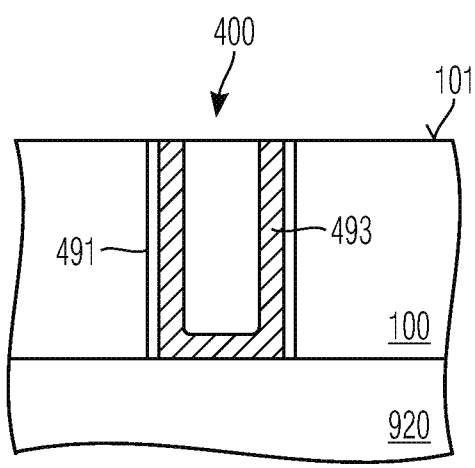

The trench isolation structure 400 shown in FIG. 3B includes a conductive layer 493. A first dielectric layer 491 separates the conductive layer 493 from the semiconductor layer 100. Alternatively, the first dielectric layer 491 may be absent and the conductive layer 493 may be in direct contact with the semiconductor layer 100. The conductive layer 493 includes two vertical portions and a horizontal portion. Alternatively, the conductive layer 493 may fill the vertical cross-section of the trench isolation structure 400.

Figure 3C:
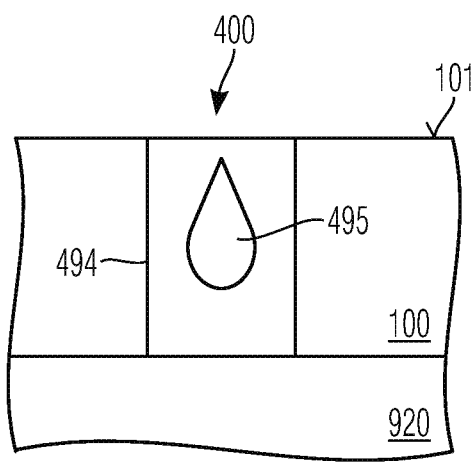

FIG. 3C shows a trench isolation structure 400 including a solid dielectric material 494 and an intentional air gap 495.

Figure 4A:
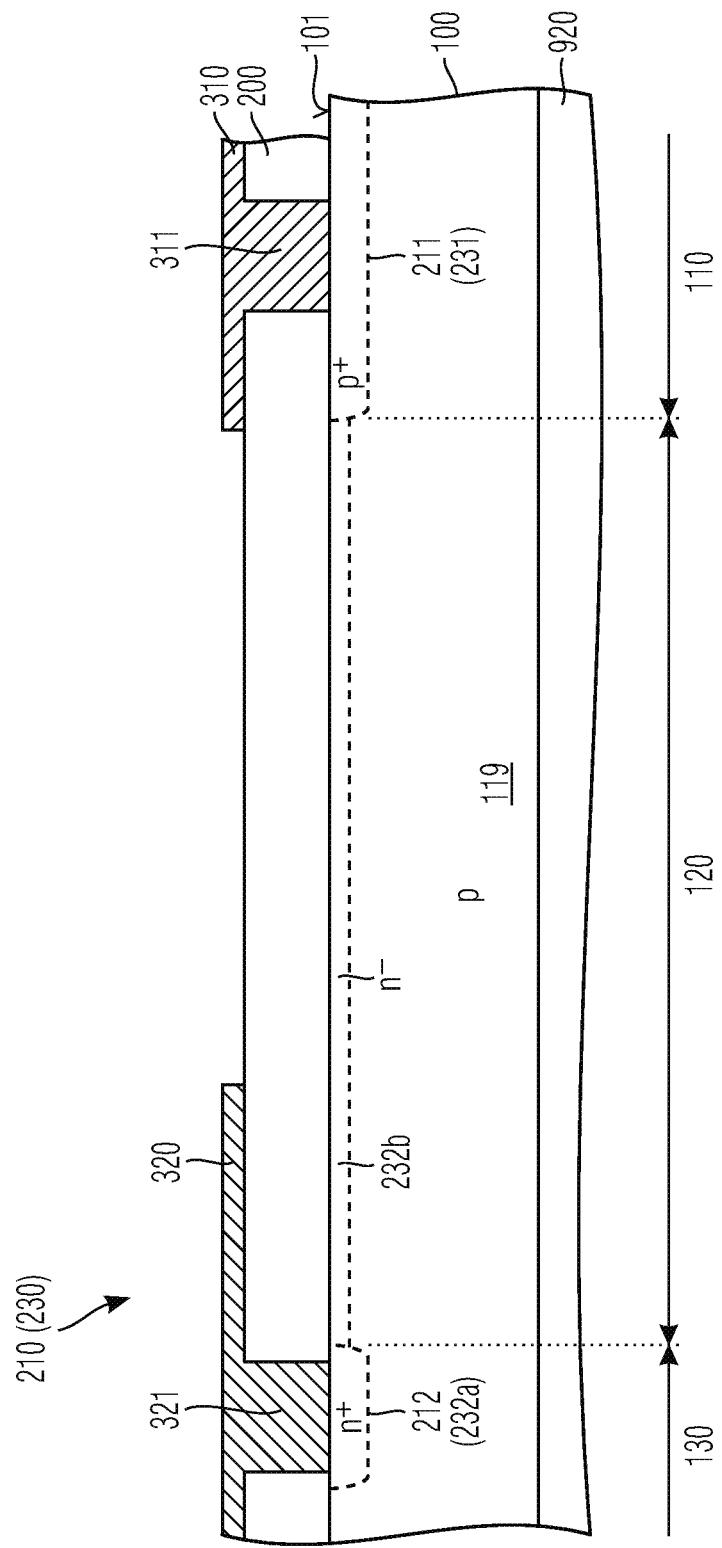
FIG. 4A is a schematic vertical cross-sectional view of a portion of a semiconductor device including a PDSOI (partially depleted silicon-on-insulator) semiconductor diode according to an embodiment.
Figure 4B:
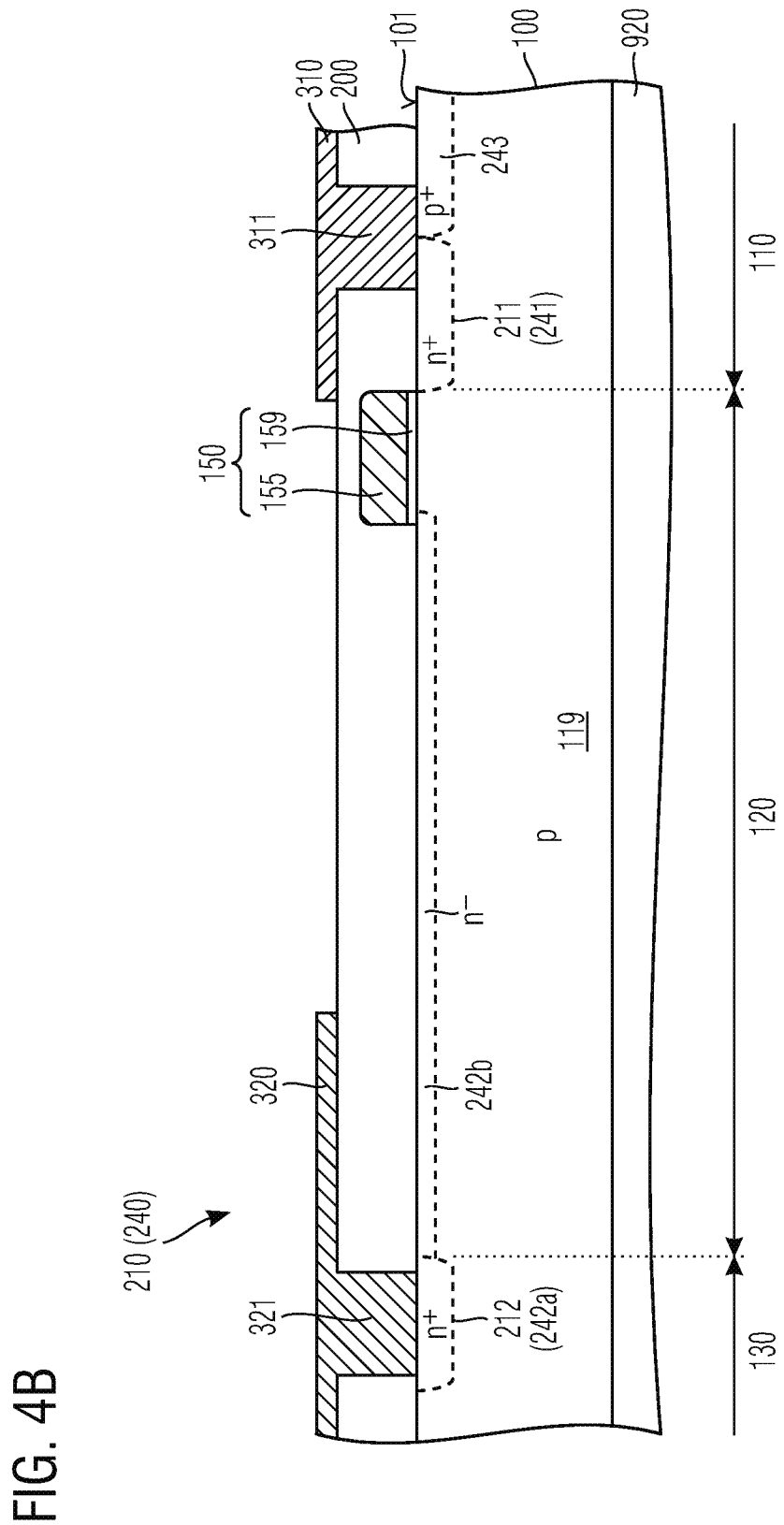
FIG. 4B is a schematic vertical cross-sectional view of a portion of a semiconductor device including a PDSOI MOSFET with drain extension according to another embodiment.

FIG. 4A and FIG. 4B show examples of first and second electric elements 210, 220 formed in two three-zone sectors I, II as illustrated in FIG. 1A, FIG. 1B and FIG. 1C.

In FIG. 4A the first electric element 210 is a semiconductor diode 230. In case of a semiconductor device with half-bridge gate driver functionality, the semiconductor diode 230 is a bootstrap diode electrically connected between a first voltage domain with a first (or second) HV part in the inner portion 110 and a second voltage domain with a second (or first) HV part in the outer portion 130.

The first doped region 211 forms a first electrode region 231 extending in the inner portion 110 from a first surface 101 of the semiconductor layer 100 into the semiconductor layer 100. The second doped region 212 forms a contact part 232a of a second electrode region and extends in the outer portion 130 from the first surface 101 into the semiconductor layer 100. A bulk portion 119 of the semiconductor layer 100 separates the first doped region 211 and the second doped region 212 from the insulator layer 920.

In the illustrated embodiment, a lightly doped extension region 232b of the second electrode region 232 extends in the transition portion 120 from the first surface 101 into the semiconductor layer 100 and is in lateral contact with the first electrode region 231 and the contact part 232a of the second electrode region 232. According to another example (not illustrated), the first doped region 211 and the second doped region 212 are connected through a surface section of the bulk portion 119.

In the illustrated embodiment, the first electrode region 231 forms a p doped diode anode region and the second electrode region 232 forms an n doped diode cathode region. According to another example, the first electrode region 231 forms the n doped diode cathode region and the second electrode region 232 forms the p doped diode anode region.

An interlayer dielectric 200 is formed on the first surface 101 and covers the extension region 232b.

A first metallization 310 is formed on the interlayer dielectric 200 above the first doped region 211. A first contact structure 311 extends from the first metallization 310 through an opening in the interlayer dielectric 200 to the first doped region 211. The first contact structure 311 and the first doped region 211 form an ohmic contact.

A second metallization 320 is formed on the interlayer dielectric 200 above the second doped region 212. A second contact structure 321 extends from the second metallization 320 through an opening in the interlayer dielectric 200 to the second doped region 212. The second contact structure 321 and the second doped region 212 form an ohmic contact.

In FIG. 4B, the first electric element 210 is an IGFET (insulated gate field effect transistor), for example an MOSFET 240. In case of a semiconductor device with half-bridge gate driver functionality, the MOSFET 240 is a level-shift transistor electrically connected between a first voltage domain with a first (or second) HV part in the inner portion 110 and a second voltage domain with a second (or first) HV part in the outer portion 130.

The first doped region 211 forms a first source/drain region 241 extending in the inner portion 110 from the first surface 101 of the semiconductor layer 100 into the semiconductor layer 100. The second doped region 212 forms a contact part 242a of a second source/drain region 242 and extends in the outer portion 130 from the first surface 101 into the semiconductor layer 100.

A lightly doped drain extension region 242b of the second source/drain region 242 extends in the transition portion 120 from the first surface 101 into the semiconductor layer 100 and is in contact with the contact part 242a. A bulk/body contact region 243 extending from the first surface 101 into the semiconductor layer 100 may be formed in the inner portion 110.

A bulk portion 119 of the semiconductor layer 100 separates the first source/drain region 241, the second source/drain region 242, and the bulk/body contact region 243 from the insulator layer 920.

The illustrated MOSFET 240 is an n-channel MOSFET with n doped source/drain regions 241, 242, p doped body region and p doped bulk/body contact region 243. Another example may be a p-channel MOSFET with p doped source/drain regions 241, 242, n doped body region and n doped bulk/body contact region 243.

A gate structure 150 is formed in the transition portion 120 on the first surface 101 between the drain extension region 242b and the first source/drain region 241. The gate structure 150 includes a conductive gate electrode 155 and a gate dielectric 159 separating the gate electrode 155 and the semiconductor layer 100.

In the illustrated embodiment, a surface section of the bulk portion 119 forms a body region of the MOSFET 240. In the on-state of the MOSFET 240, a conductive charge carrier channel forms in the body region directly below the gate dielectric 159 and connects the first source/drain region 241 and the second source drain region 242. According to another example (not illustrated), a p doped well extending from the first surface 101 into the semiconductor layer 100 may form the body region.

An interlayer dielectric 200 is formed on the first surface 101 and covers the gate structure 150 and the drain extension region 242b.

A first metallization 310 is formed on the interlayer dielectric 200 above the first doped region 211. A first contact structure 311 extends from the first metallization 310 through an opening in the interlayer dielectric 200 to the first doped region 211. The first contact structure 311 and the first doped region 211 form an ohmic contact and, in addition, the first contact structure 311 and the bulk/body contact region 243 may form an ohmic contact.

A second metallization 320 is formed on the interlayer dielectric 200 above the second doped region 212. A second contact structure 321 extends from the second metallization 320 through an opening in the interlayer dielectric 200 to the second doped region 212. The second contact structure 321 and the second doped region 212 form an ohmic contact.

Figure 5A:
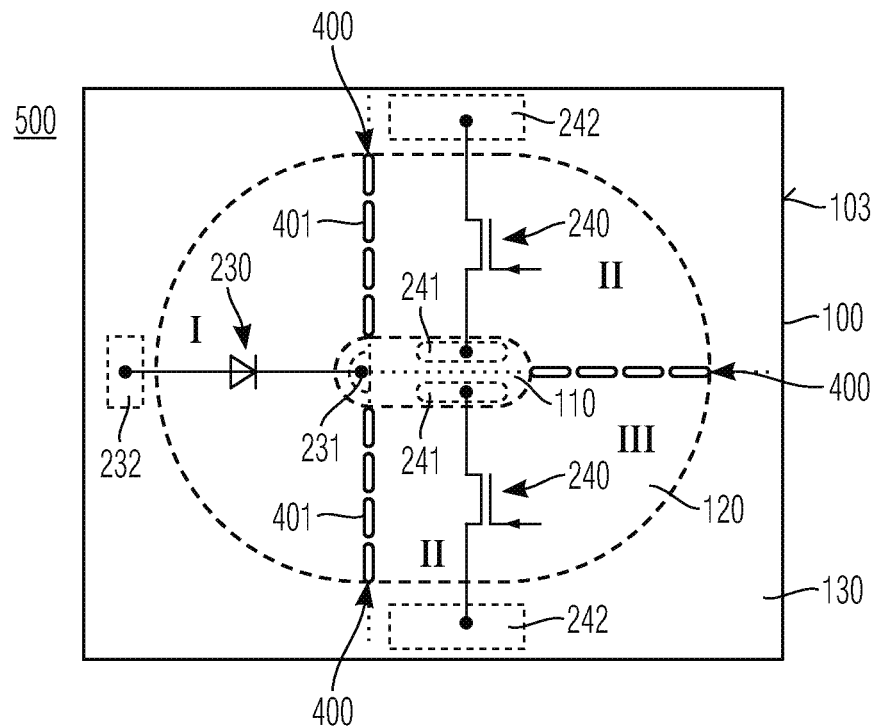
FIG. 5A and FIG. 5B are schematic plan views of semiconductor devices according to embodiments related to trench isolation structures including a plurality of short trenches.
Figure 5B:
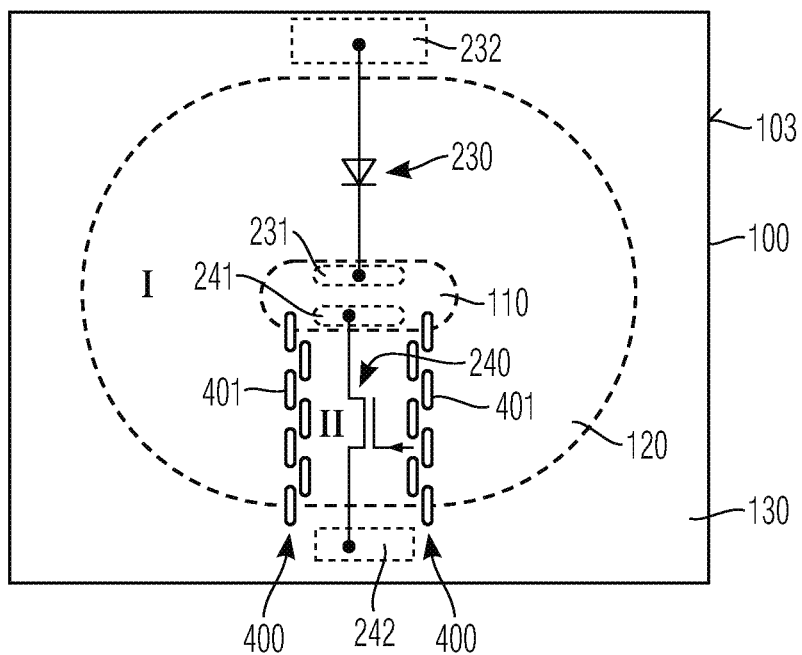

FIG. 5A and FIG. 5B show trench isolation structures 400 including a plurality of short trenches 401 formed along straight trench lines directly connecting the inner portion 110 and the outer portion 130.

Each trench line with short trenches 401 forms one trench isolation part. The length of the short trenches 401 along the straight trench line is smaller than a width of the transition portion 120 along the same trench line.

In FIG. 5A the trench isolation structure 400 includes three trench isolation parts, wherein each trench isolation part includes a plurality of short trenches 401 formed on a straight line directly connecting the inner portion 110 and the outer portion 130.

The trench isolation structure 400 divides the semiconductor layer 100 into three three-zone sectors I, II, III. A semiconductor diode 230 with first and second electrode regions 251, 252 is formed in the first three-zone sector I. A first MOSFET 240 with first and second source/drain regions 241, 242 is formed in the second three-zone sector II. A second MOSFET 240 with first and second source/drain regions 241, 242 is formed in the third three-zone sector III.

FIG. 5B shows a trench isolation structure 400 with two trench isolation parts defining two three-zone sectors I, II. Each trench isolation part includes a plurality of short trenches 401 formed along two neighboring straight trench lines. Each of the two adjacent straight trench lines extends from the inner portion 110 to the outer portion 130. A distance between the two straight trench lines associated with the same trench isolation part is at most five times, e.g. at most twice the width of the short trenches orthogonal to the straight trench line. No electric element is formed between the two trench lines associated with the same trench isolation part.

The short trenches in trench lines associated with the same trench isolation part are shifted to each other along the trench line by half the center-to-center distance between neighboring short trenches along the same trench line.

Figure 6A:
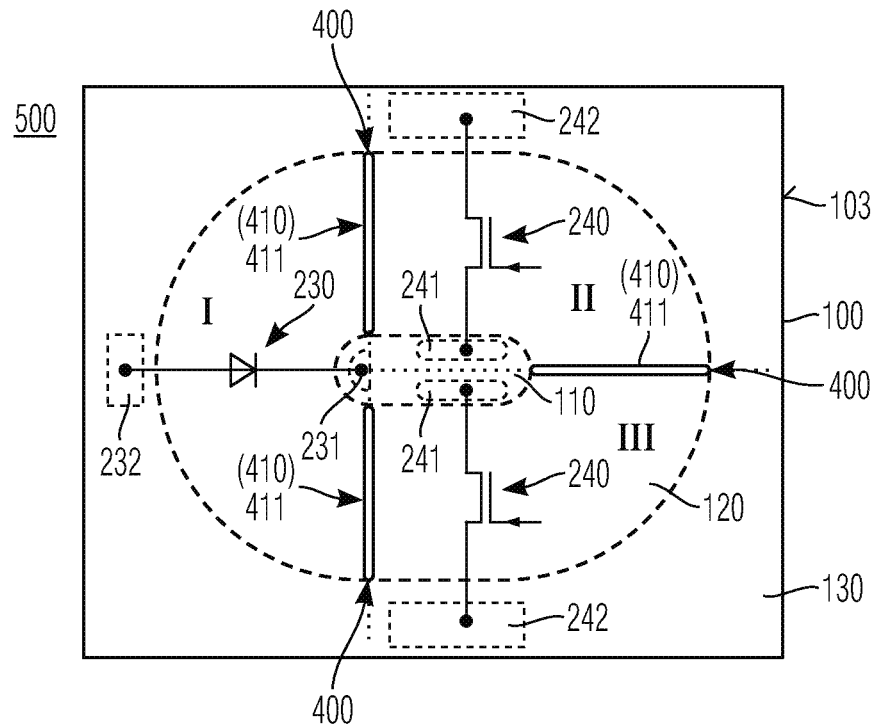
FIG. 6A to FIG. 6D are schematic plan views of semiconductor devices according to embodiments related to trench isolation structures dividing the transition portion into segments.

The trench isolation structure 400 in FIG. 6A includes three continuous trench isolation parts 410 segmenting the transition portion 120 into three transition segments associated with three three-zone sectors I, II, III. Each continuous trench isolation part 410 extends from the interface between inner portion 110 and transition portion 120 to the interface between the transition portion 120 and the outer portion 130.

Figure 6B:
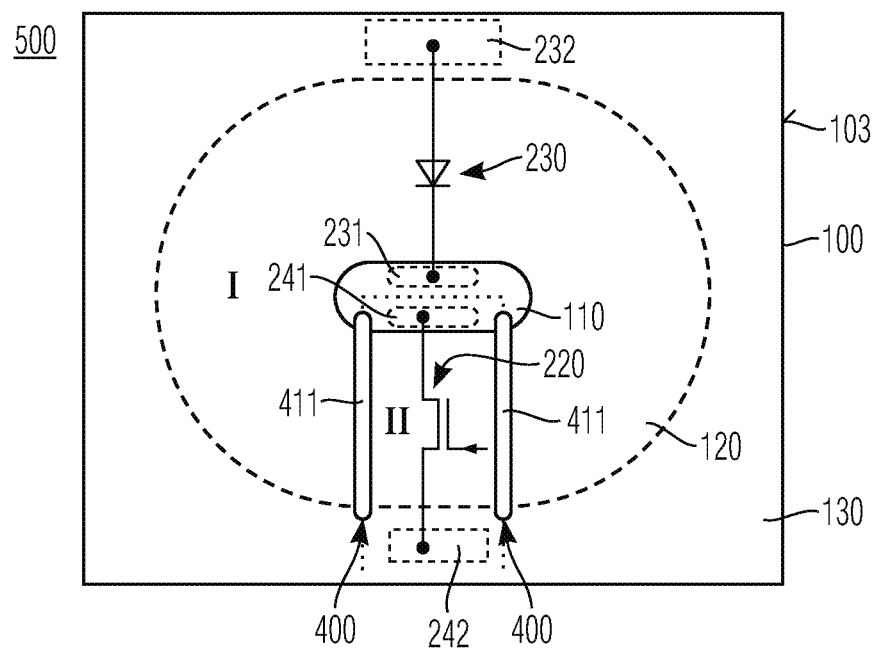

In FIG. 6B the trench isolation structure 400 includes two continuous trench isolation parts 410 segmenting the transition portion 120 into two transition segments associated with two three-zone sectors I, II. Each continuous trench isolation part 410 extends through the transition portion 120 and into directly adjoining portions of the inner portion 110 and the outer portion 130.

Figure 6C:
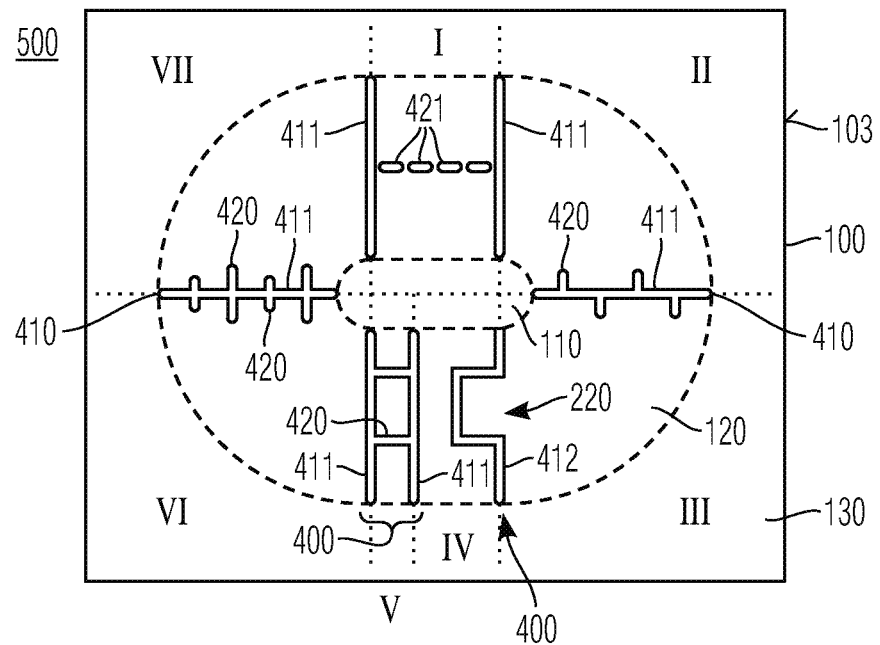

In FIG. 6C the trench isolation structure 400 includes seven trench isolation parts segmenting the transition portion 120 into seven segments associated with seven three-zone sectors I-VII.

A meandering trench isolation part 412 extends between the third and the fourth three-zone sectors III, IV from the interface between the inner portion 110 and the transition portion 120 to the interface between the transition portion 120 and the outer portion 130. The meandering trench isolation part 412 forms a line of pockets in the transition portion 120, wherein the meandering trench isolation part confines each pocket on three lateral sides. A diode chain with a plurality of diodes electrically connected in series between a doped region in the inner portion 110 and a second doped region in the outer portion 130 may be formed along the meandering trench isolation part 412.

The trench isolation structure 400 further includes six continuous and straight trench isolation parts 411 and transverse trench parts 420. The transverse trench parts 420 may run at right angle to the straight trench isolation part 411. A number of transverse trench parts 420 in contact with the same straight trench isolation part 411 may define a line of pockets between them, wherein the straight trench isolation part 411 and the transverse trench parts 420 confine each pocket on two or three lateral sides.

Two neighboring straight trench isolation parts 411 separating the transition segment associated with the fifth three-zone sector V from the transition segments associated with the fourth and sixth three-zone sectors IV, VI and transverse trench parts 420 connecting the two neighboring straight trench isolation parts 411 form an isolation trench ladder. Rails and rungs of the isolation trench ladder confine isolated islands in the transition portion 120 on four lateral sides.

In the first three-zone sector I short transverse parts 421 formed on a line connecting the two neighboring straight trench isolation parts 411 reduce the radial conductivity for improving stability at short circuit conditions.

Figure 6D:
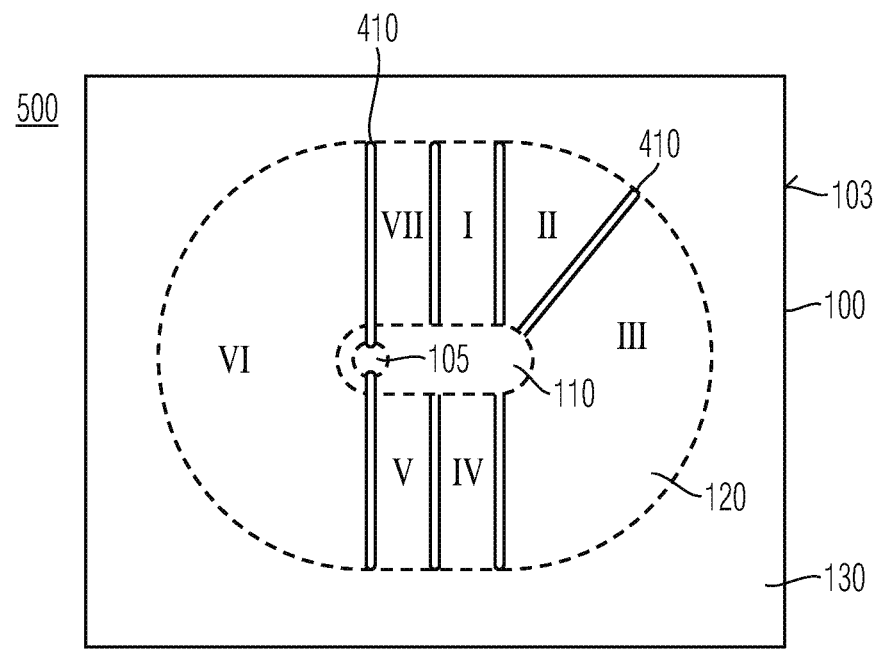

In FIG. 6D the trench isolation structure 400 includes seven continuous and straight trench isolation parts 411 segmenting the transition portion 120 into seven transition segments associated with seven three-zone sectors I-VII. The inner portion 110 may surround a further inner portion 105. Some of the trench isolation parts 411 may extend through the inner portion 110 and into the further inner portion 105.

Figure 7A:
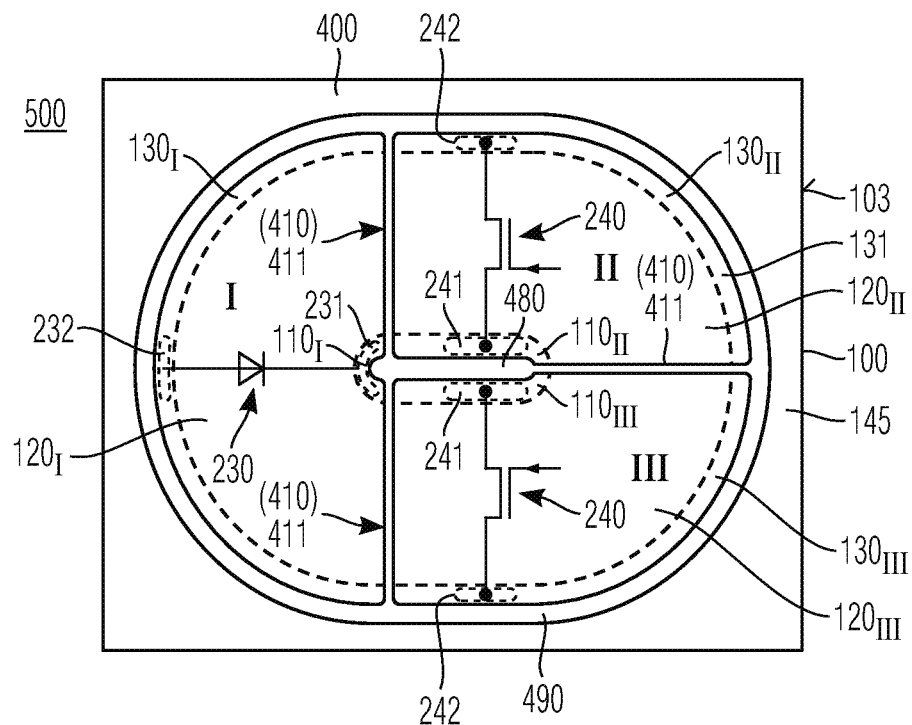
FIG. 7A to FIG. 7D are schematic plan views of semiconductor devices according to embodiments related to trench isolation structures extending from an inner trench structure to an outer trench structure that laterally surrounds the outer portion.

FIG. 7A shows a semiconductor device 500 with an outer trench structure 490 laterally surrounding a first part 131 of the outer portion 130. The outer trench structure 490 completely separates the first part 131 of the outer portion 130 from a second part of the outer portion 130, wherein the second part of the outer portion 130 forms an outer device portion 145 as described above.

The trench isolation structure 400 includes a central trench part 480 in the inner portion 110 and three continuous straight trench isolation parts 411 extending from the central trench part 480 through the transition portion 120 and through the outer portion 130 to the outer trench structure 490.

The straight trench isolation parts 411 divide the inner portion 110 into three separated inner sectors 110-I, 110-II, 110-III, the transition portion 120 into three separated transition segments 120-I, 120-II, 120-III, and the outer portion 130 into three separated outer segments 130-I, 130-II, 130-III. The first inner sector 110-I, the first transition segment 120-I, and the first outer segment 130-I form a first three-zone sector I. The second inner sector 110-II, the second transition segment 120-II, and the second outer segment 130-II form a second three-zone sector II. The third inner sector 110-III, the third transition segment 120-III, and the third outer segment 130-III form a third three-zone sector III.

Figure 7B:
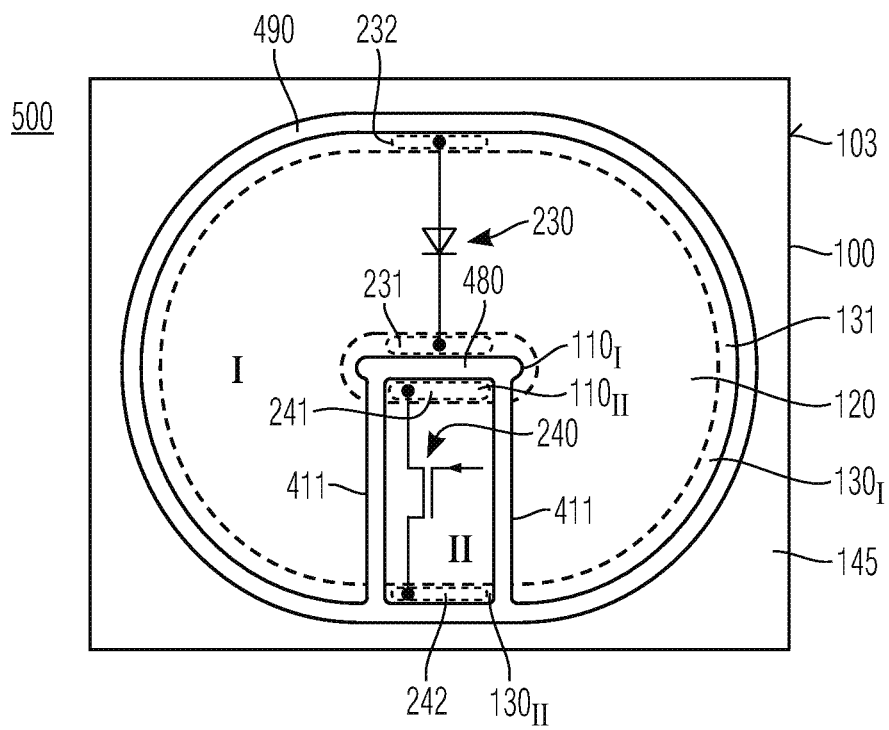

In FIG. 7B two straight trench isolation parts 411 divide the inner portion 110 into two separated inner sectors 110-I, 110-II, the transition portion 120 into two separated transition segments 120-I, 120-II, and the outer portion 130 into two separated outer segments 130-I, 130-II. The first inner sector 110-I, the first transition segment 120-I, and the first outer segment 130-I form a first three-zone sector I. The second inner sector 110-II, the second transition segment 120-II, and the second outer segment 130-II form a second three-zone sector II.

Figure 7C:
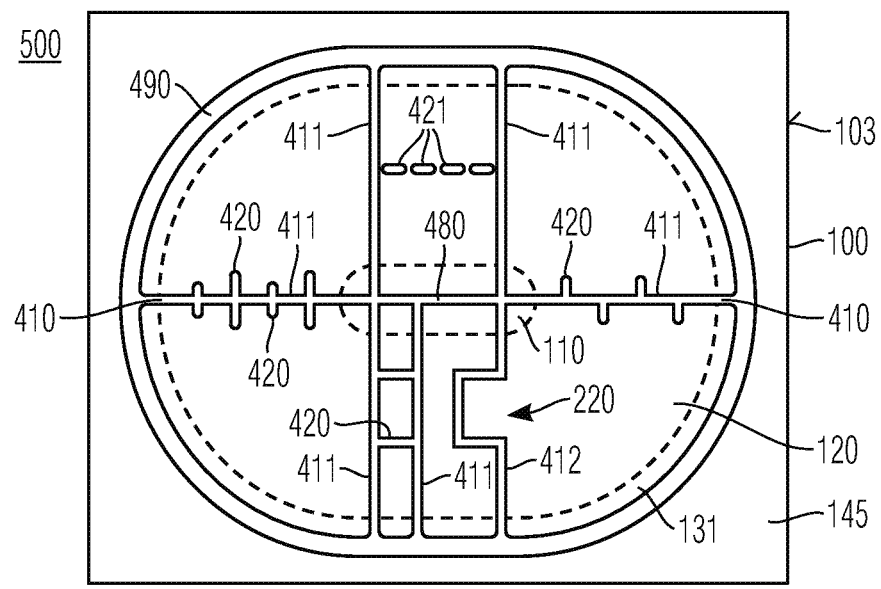

FIG. 7C combines the trench isolation structure 400 of FIG. 6C with a central trench part 480 and an outer trench structure 490 as described with reference to FIG. 7A.

Figure 7D:
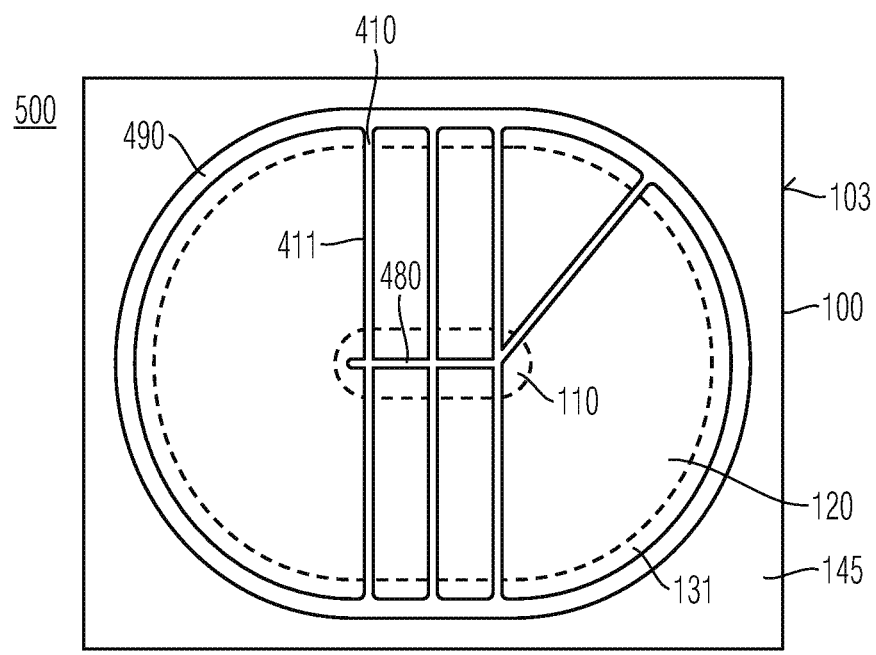

FIG. 7D combines the trench isolation structure 400 of FIG. 6D with a central trench part 480 and an outer trench structure 490 as described with reference to FIG. 7A.

Figure 8:
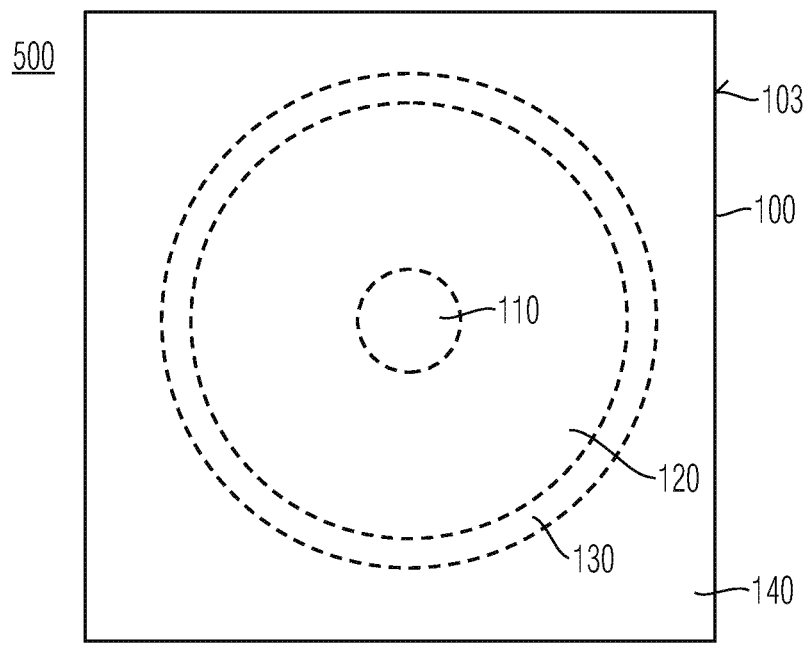
FIG. 8 is a schematic plan view of a semiconductor device according to an embodiment with circular transition portion.
Figure 9:
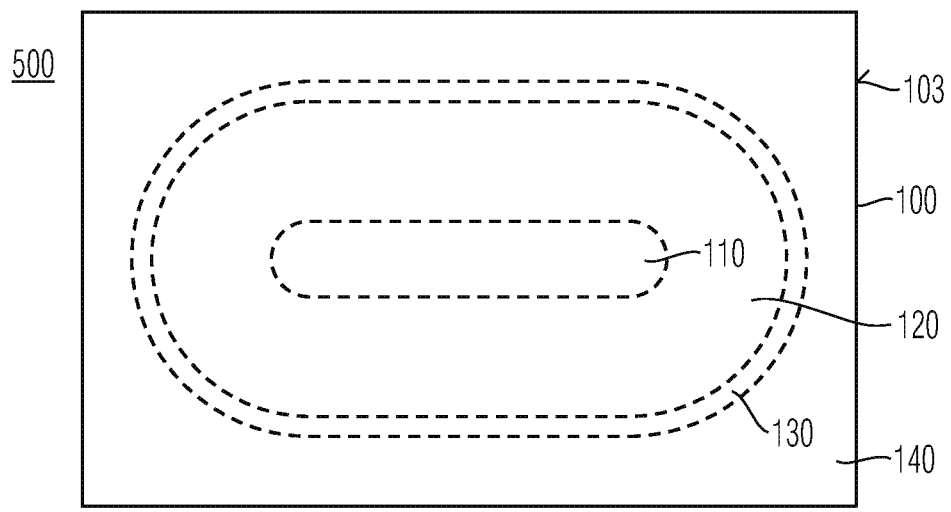
FIG. 9 is a schematic plan view of a semiconductor device according to an embodiment with oval transition portion.
Figure 10:
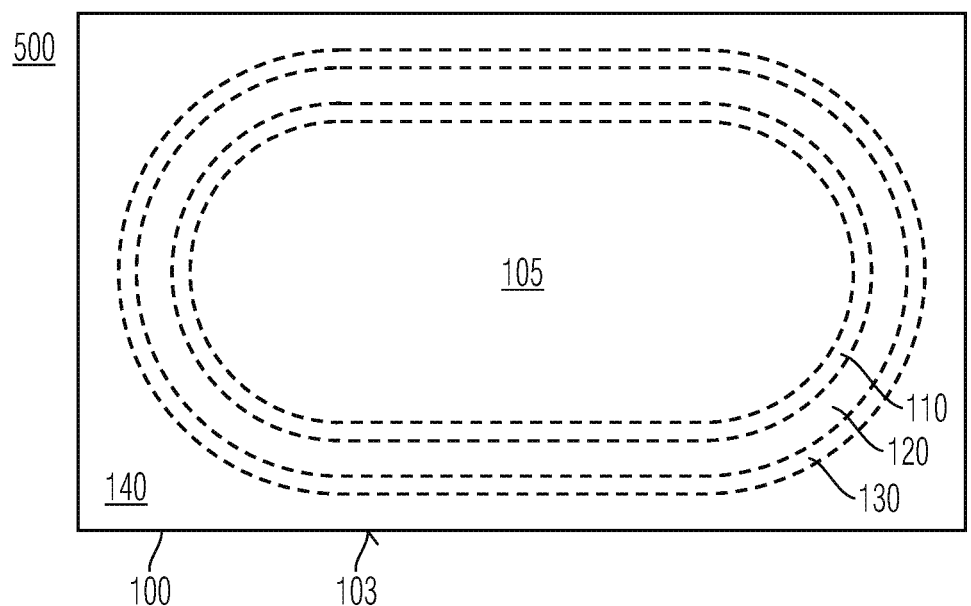
FIG. 10 is a schematic plan view of a semiconductor device according to an embodiment with a central portion surrounded by the inner portion.

FIG. 8, FIG. 9 and FIG. 10 illustrate possible configurations of radial devices with a first voltage domain in an inner portion 110, a second voltage domain in an outer portion 130 and with a transition portion 120 electrically separating the inner portion 110 and the outer portion 130. A higher potential may be applied to the inner portion 110 and a lower potential may be applied to the outer portion 130, or vice versa.

FIG. 8 shows a circular inner portion 110. The transition portion 120 forms a circular ring around the inner portion 110. The outer portion 130 forms a circular ring around the transition portion 120.

In FIG. 9 the inner portion 110 has the form of an oval without openings.

FIG. 10 shows an inner portion 110 surrounding a further inner portion 105. The further inner portion 105 may be a separated voltage domain with isolation via a termination ring.

Figure 11:
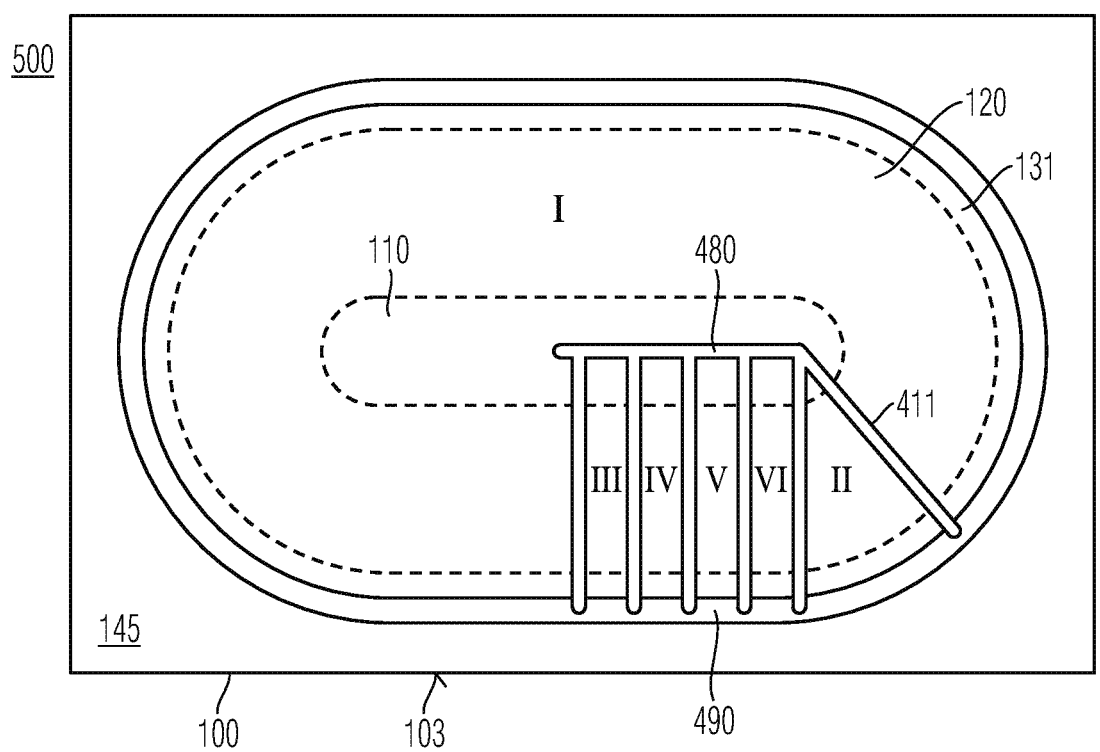
FIG. 11 is a schematic plan view of a semiconductor device according to an embodiment related to trench isolation structures extending from an inner trench structure to an outer trench structure and dividing the transition portion into six sectors.

The semiconductor device 500 shown in FIG. 11 is a half-bridge gate driver circuit with a bootstrap diode formed in a first three-zone sector I, a level shift transistor, a sense element and/or a protection element formed in a second three-zone sector II, two MOSFETs for a high-side driver stage formed in a third three-zone sector III and a fourth three-zone sector IV, and two MOSFETs for a low-side driver stage formed in a fifth three-zone sector V and a sixth three-zone sector VI.

FIG. 12, FIG. 13, FIG. 14, FIG. 15, and FIG. 16 refer to semiconductor devices 500 combining isolation trench structures 400 with junction isolation regions 470.

A first LDMOSFET 240-1 with a gate electrode 155-1, a first source/drain region 241-1, and a second source/drain region, which includes a contact part 242a-1 and a drain extension region 242b-1, is formed in a first three-zone sector I. A second LDMOSFET 240-2 with a gate electrode 155-2, a first source/drain region 241-2, and a second source/drain region, which includes a contact part 242a-2 and a drain extension region 242b-2, is formed in a second three-zone sector II.

The first LDMOSFET 240-1 and the second LDMOSFET 240-2 may be formed symmetrically with respect to an x-axis and to a y-axis.

A trench isolation structure 400 divides the inner portion 110 into two inner sectors, wherein each inner sector includes one of the first source/drain regions 241-1, 241-2.

Within the first and second three-zone sectors I, II the transition portion 120 includes the drain extension regions 242b-1, 242b-2. Outside the first and second three-zone sectors I, II the transition portion 120 includes junction isolation regions 470. The drain extension regions 242b-1, 242b-2 and the contact parts 242a-1, 242a-2 of the second source/drain regions may be formed by locally implanting dopants and diffusing the implanted dopants. Sections of the transition portion 120 and the outer portion 130 that do not receive dopant implants or that receive only a part of the dopant implants may form the junction isolation regions 470.

In case of a semiconductor device with half-bridge gate driver functionality, the first LDMOSFET 240-1 and the second LDMOSFET 240-2 are level-shift transistors electrically connected between a first voltage domain with a first (or second) HV part in the inner portion 110 and a second voltage domain with a second (or first) HV part in the outer portion 130, or between a CMOS part and the first HV part and between the CMOS part and the second HV part.

Each of FIG. 12 to FIG. 16 shows a closed trench ring 440 that separates a second part 132 of the outer portion 130 from a first part 131 of the outer portion 130 and from the transition portion 120. Segments of the closed trench ring 440 outside the first and second three-zone sectors I and II form junction region trenches 445 that may laterally separate the outer region 130 from the junction isolation regions 470 along the radial direction.

In each of the embodiments illustrated in FIG. 12 to FIG. 16, the closed trench ring 440 may be absent completely or in parts. For example, segments of a trench ring in the first and second three-zone sectors I and II may be absent and only segments of a trench ring forming the junction region trenches 445 between the transition portion 120 and the outer portion 130 may be formed. Alternatively, in each of the embodiments illustrated in FIG. 12 to FIG. 16, only segments of a trench ring in the first and second three-zone sectors I and II may be formed and segments of a trench ring outside the first and second three-zone sectors I and II may be absent. In the absence of segments of a trench ring outside the first and second three-zone sectors I and II, the junction isolation regions 470 may be in contact with shallow trench isolation structures and/or with p conductive regions in the outer portion 130 in the radial direction.

The contact parts 242a-1, 242a-2 of the second source/drain regions are formed in the first part 131 of the outer portion 130. Conductive structures on the front side of the semiconductor layer may electrically connect the contact parts 242a-1, 242a-2 with further conductive structures in the second part 132 of the outer portion 130 outside the closed trench ring 440. Segments of the closed trench ring 440 form junction region trenches 445 that may laterally separate the outer region 130 and the junction isolation regions 470 along the radial direction outside the first and second three-zone sectors I, II.

Figure 12:
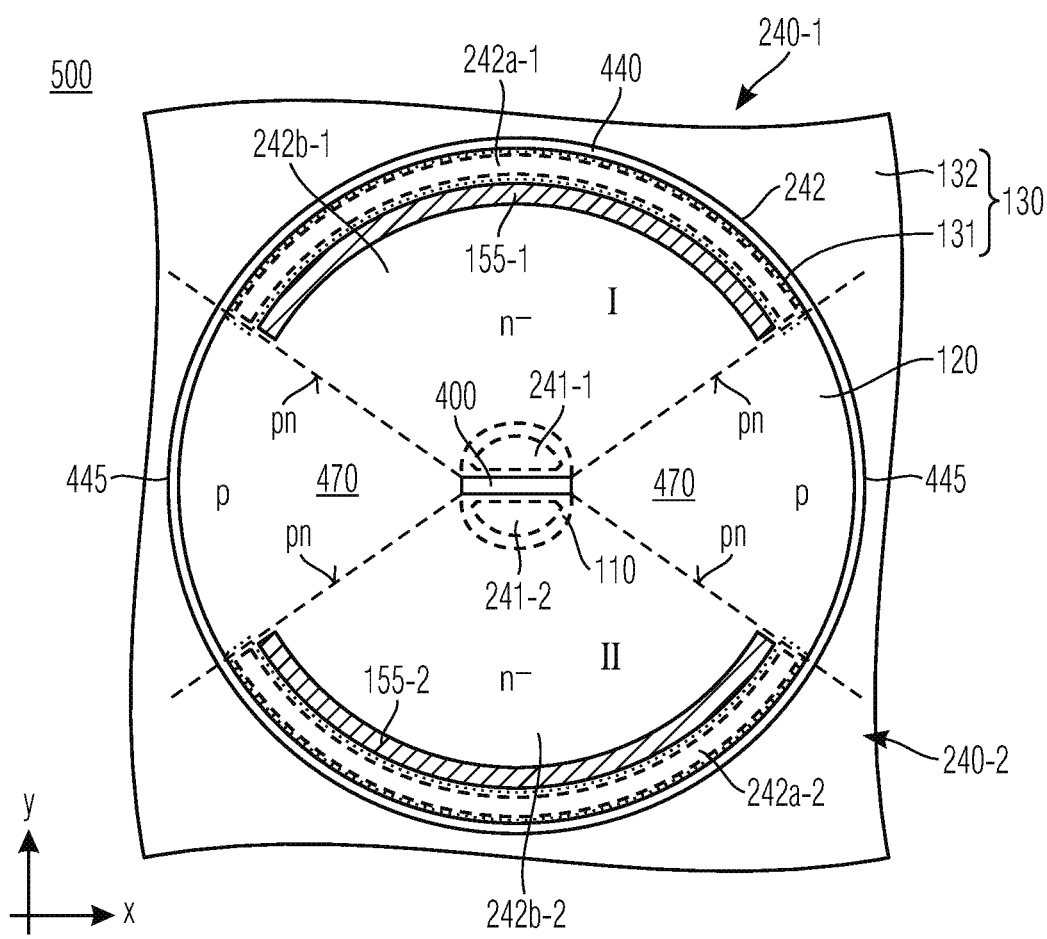
FIG. 12 is a schematic plan view of a portion of a semiconductor device according to an embodiment with a trench structure dividing the inner portion into sectors and with a transition portion including junction isolation regions.

In FIG. 12, the junction isolation regions 470 of the transition portion 120 separate two transition segments including the drain extension regions 242b-1, 242b-2 and laterally separate the contact parts 242a-1, 242a-2 of the second source/drain regions. The junction isolation regions 470 and the drain extension regions 242b-1, 242b-2 are oppositely doped and form pn junctions extending in the radial direction along the edges of the three-zone sectors I, II.

Figure 13:
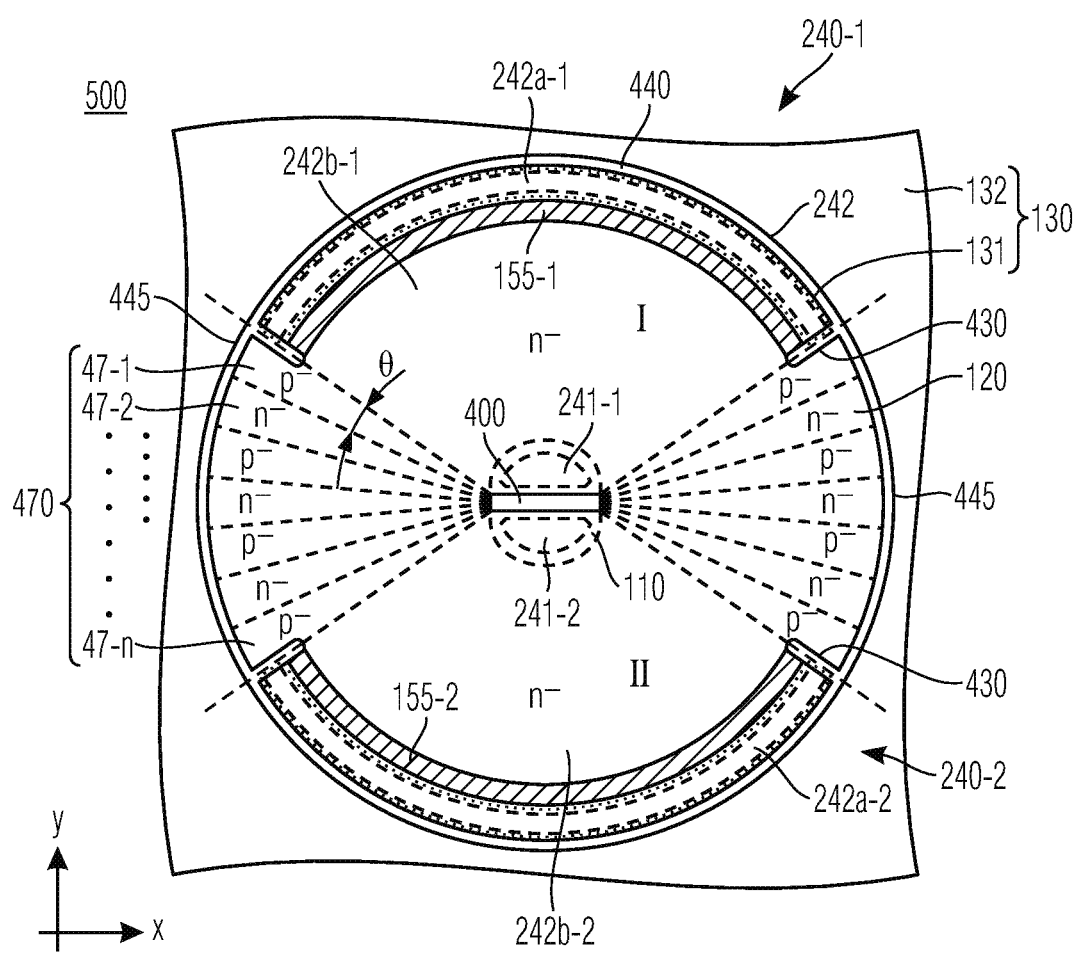
FIG. 13 is a schematic plan view of a portion of a semiconductor device according to an embodiment with trench structures dividing the inner portion into sectors and with a transition portion including junction isolation regions with oppositely doped subsegments.

In FIG. 13 each junction isolation region 470 includes a plurality of subsegments 47-1, 47-2, . . . , 47-n, whose conductivity type alternate along the angular direction. All subsegments 47-1, 47-2, . . . , 47-n or at least all subsegments 47-1, 47-2, . . . , 47-n of the same conductivity type may have the same angular extension θ.

FIG. 13 further refers to trench isolation structures 400 with trench isolation parts 430 extending from the outer portion 130 to or into the transition portion 120. Each trench isolation part 430 may extend with a lateral longitudinal axis parallel to the radial direction along the edges of the three-zone sectors I, II. The trench isolation parts 430 laterally separate the contact parts 242a-1, 242a-2 of the second source/drain regions from the junction isolation regions 470.

The trench isolation parts 430 may extend into the transition portion 120 to a degree that the trench isolation parts 430 laterally separate the junction isolation regions 470 from the body regions, which are formed below the gate electrodes 155.

Figure 14:
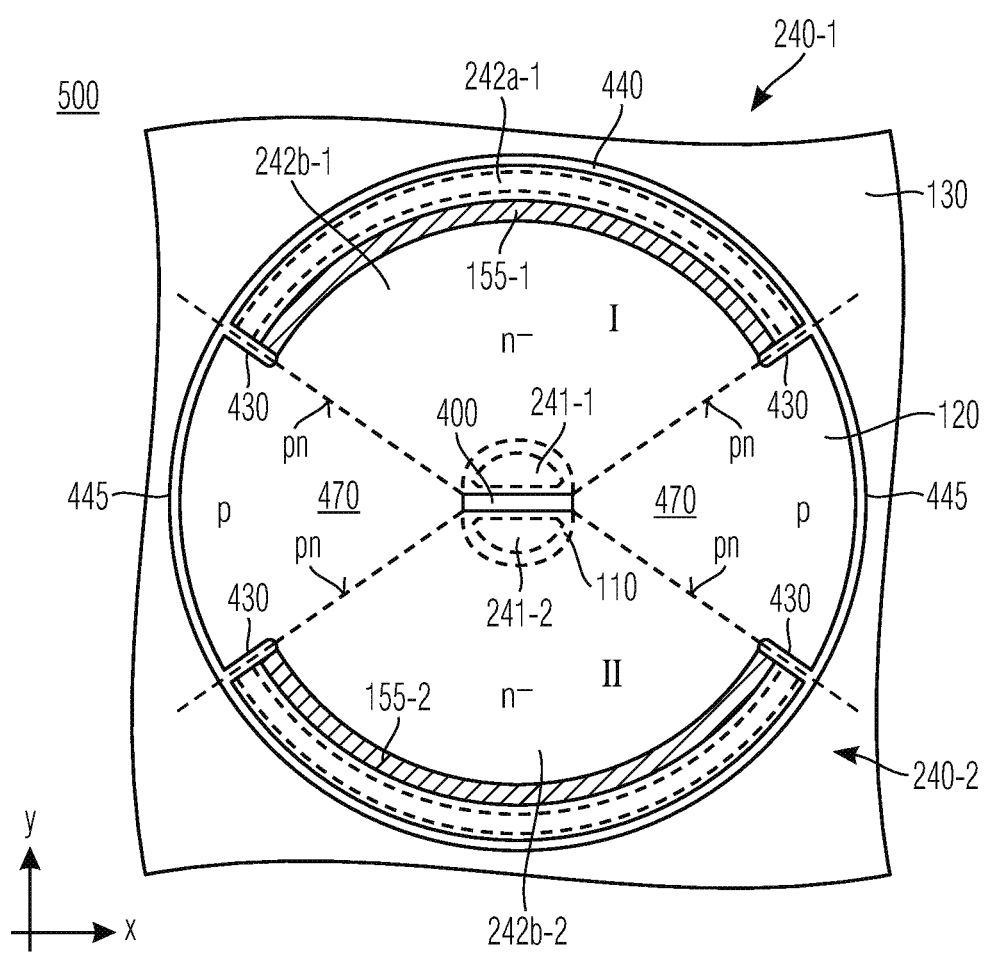
FIG. 14 is a schematic plan view of a portion of a semiconductor device according to an embodiment with trench structures dividing the inner portion into sectors, with a closed trench ring between transition portion and outer portion and with junction region trenches extending from the closed trench ring into the transition portion.

FIG. 14 combines p doped junction isolation regions 470 with trench isolation parts 430 laterally separating the junction isolation regions 470 from the contact parts 242a-1, 242a-2 of the second source/drain regions and from the body regions, which are formed below the gate electrodes 155.

Figure 15:
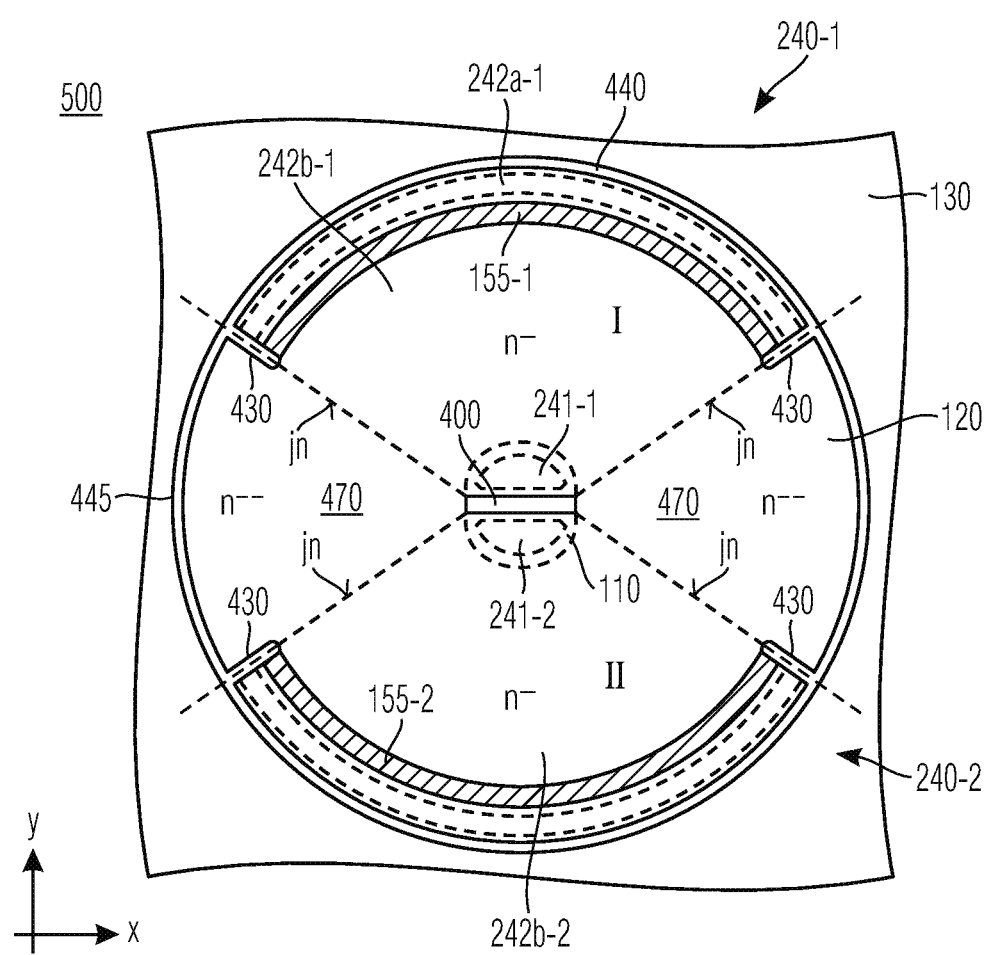
FIG. 15 is a schematic plan view of a portion of a semiconductor device according to an embodiment with trench structures dividing the inner portion into sectors and with a transition portion including junction isolation regions and extension regions of the same conductivity type.

In FIG. 15, the junction isolation regions 470 and the drain extension regions 242b-1, 242b-2 have the same conductivity type and form unipolar junctions jn. A mean net dopant concentration in the drain extension regions 242b-1, 242b-2 may be at least twice as high, e.g. at least ten times as high as the mean net dopant concentration in the junction isolation regions 470.

Figure 16:
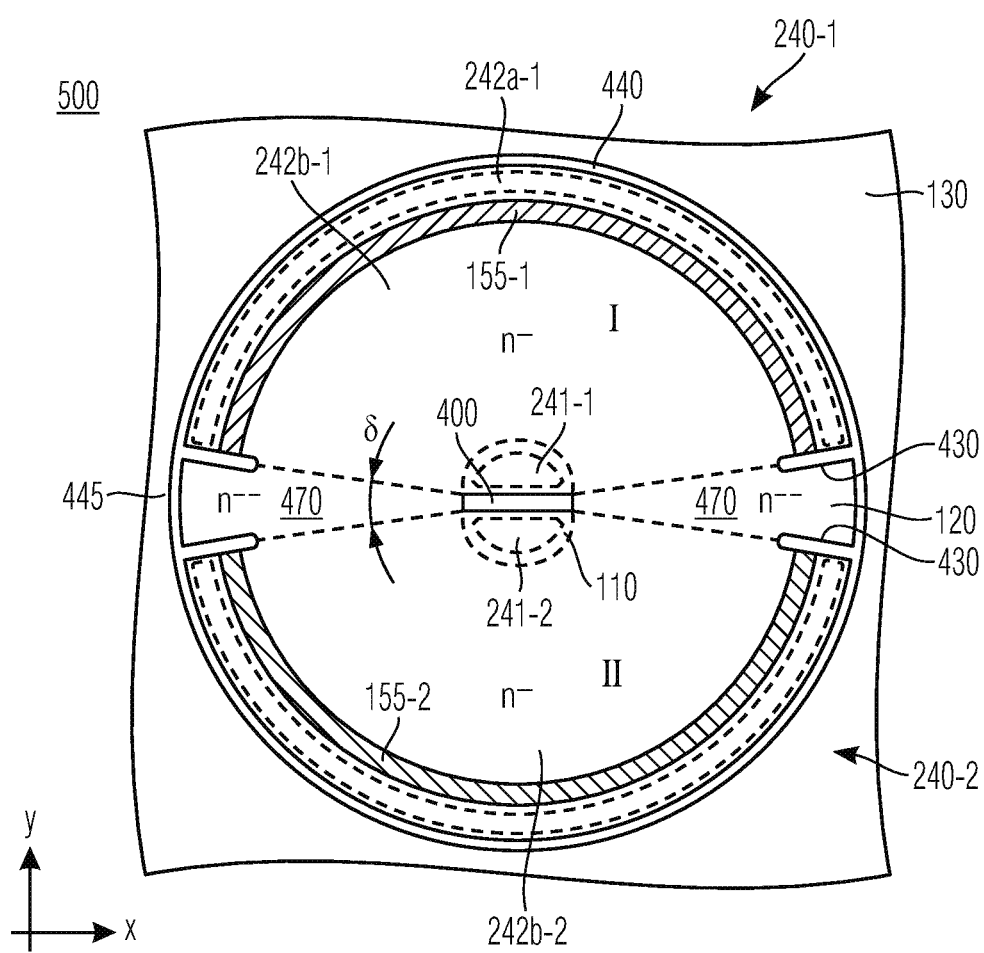
FIG. 16 is a schematic plan view of a portion of a semiconductor device according to an embodiment with a trench structure dividing the inner portion into sectors and with a transition portion including narrow junction isolation regions.

FIG. 16 shows a semiconductor device 500 with comparatively narrow junction isolation structures 470. An angular width 5 of the junction isolation structures 470 may be in a range from 5 degree to 45 degree, by way of example.

Figure 17:
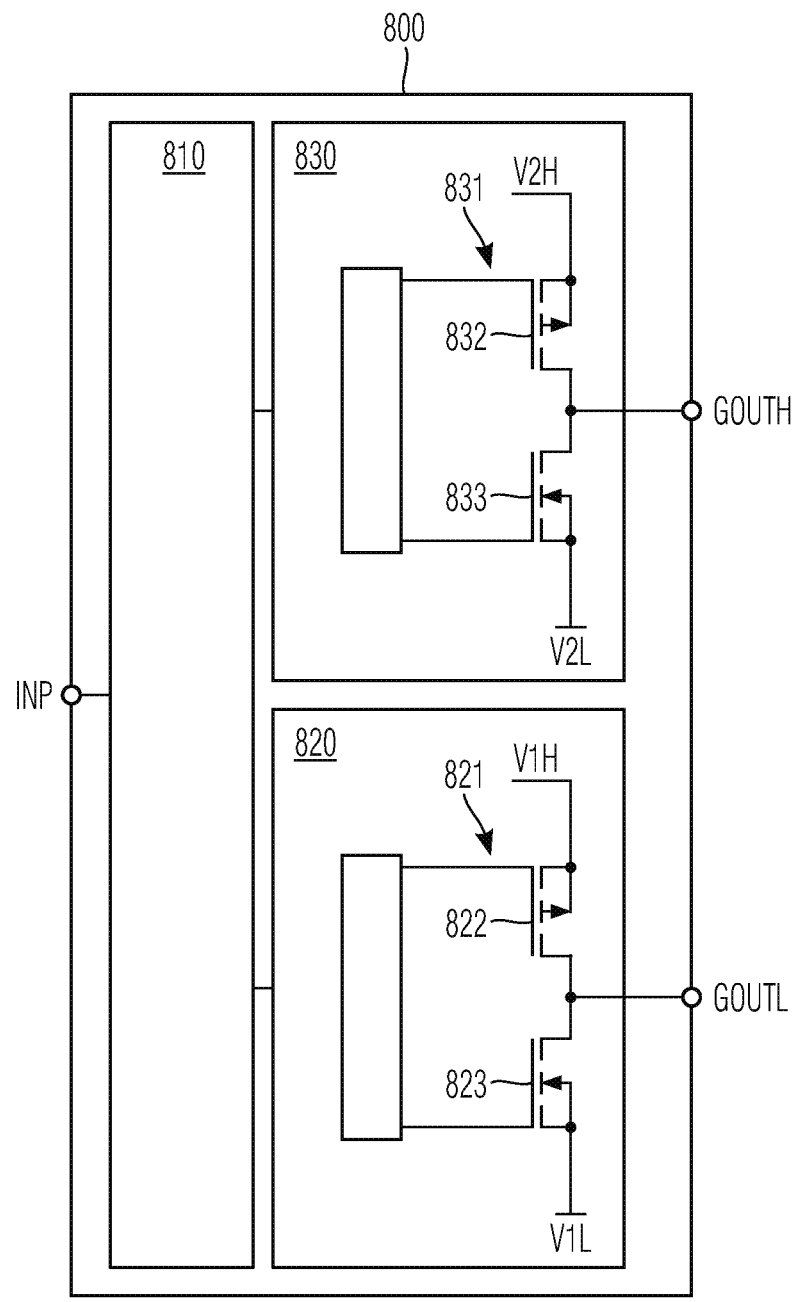
FIG. 17 is a schematic block diagram of a gate driver circuit according to a further embodiment.

FIG. 17 shows building blocks of a gate driver circuit 800. The gate driver circuit 800 enables a micro-controller or digital signal processor to efficiently turn on and turn off power semiconductor switches such as IGBTs or MOSFETs in power conversion circuits and motor control application.

The gate driver circuit 800 is configured as a half-bridge gate driver device that includes a first gate driver stage 820 in a first voltage domain, a second gate driver stage 830 in a second voltage domain, and an input stage 810 in a third voltage domain. The input stage 810 receives an input signal at one or more input terminals INP. The input signal may include square pulses and may be received from a pulse width modulator circuit. The input stage 810 may pre-process the input signal and may transfer the pre-processed input signal to the first and second gate driver stages 820, 830 which may be electrically separated from the input stage 810.

The first gate driver stage 820 includes a first buffer stage 821. In response to the received pre-processed input signal, the first buffer stage generates and drives a first gate signal for a first voltage controlled switching device, e.g. the low-side switch of a half-bridge assembly, and outputs the first gate signal at a first gate output terminal GOUTL.

The second gate driver stage 830 includes a second buffer stage 831. In response to the received pre-processed input signal, the second gate driver stage 830 generates and drives a second gate signal for a second voltage controlled switching device, e.g. the high-side switch of a half-bridge assembly, and outputs the second gate signal at a second gate output terminal GOUTH.

The first buffer stage 821 and/or the second buffer stage 831 include an inverter stage, e.g. a push-pull driver, with the source/drain paths of a p-MOSFET 822, 832 and an n-MOSFET 823, 833 electrically connected in series between a high potential line V1H, V2H and a low potential line V1L, V2L of the respective stage.

The network node between the p-MOSFET 822 and n-MOSFET 823 of the first buffer stage 821 is electrically connected with the first gate output terminal GOUTL. The network node between the p-MOSFET 832 and n-MOSFET 833 of the second buffer stage 831 is electrically connected with the second gate output terminal GOUTH.

In each buffer stage 821, 831, the p-MOSFET 822, 832 and the n-MOSFET 823, 833 are alternatingly turned on and off, wherein at each point in time only one of the p-MOSFET 822, 832 and the n-MOSFET 823, 833 of the same buffer stage 821, 831 is in the on-state.

The gate driver circuit 800 may further include a bootstrap diode for supplying the second buffer stage 830.

The gate driver circuit 800 may include one or more level shift transistors, between the input stage 810 and the first gate driver stage 820 and/or between the input stage 810 and the second gate driver stage 830, and/or between first gate driver stage 820 and the second gate driver stage 830.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor layer comprising an inner portion, an outer portion laterally surrounding the inner portion, and a transition portion laterally surrounding the inner portion and separating the inner portion and the outer portion;
    a trench isolation structure extending from a first surface into the semiconductor layer, wherein the trench isolation structure segments at least one of the inner portion, the transition portion, and the outer portion and divides the inner portion, the transition portion, and the outer portion into at least a first three-zone sector I and a second three-zone sector II;
    a first electric element formed in the first three-zone sector I and comprising a first doped region formed in the inner portion and a second doped region formed in the outer portion, wherein the first electric element is configured to at least temporarily block a voltage applied between the first doped region and the second doped region; and
    a second electric element formed in the second three-zone sector II and comprising a first doped region formed in the inner portion and a second doped region formed in the outer portion, wherein the second electric element is configured to at least temporarily block a voltage applied between the first doped region and the second doped region of the second electric element, and wherein the first doped region of the first electric element and the first doped region of the second electric element are electrically separated from one another.

2. The semiconductor device of claim 1, further comprising:
    an insulator layer,
    wherein the semiconductor layer is formed on the insulator layer, and
    wherein the trench isolation structure extends from a first surface at a front side of the semiconductor layer to the insulator layer.

3. The semiconductor device of claim 1, wherein the first electric element comprises a diode, wherein the first doped region forms at least part of a first electrode region of the diode, wherein the second doped region forms at least part of a second electrode region of the diode, and wherein the first and second electrode region form a pn junction.

4. The semiconductor device of claim 1, wherein the first electric element comprises an insulated gate field effect transistor, wherein the first doped region forms at least part of a first source/drain region, wherein the second doped region forms at least part of a second source/drain region, and wherein in an on-state of the insulated gate field effect transistor, a charge carrier channel connects the first and second source/drain regions.

5. The semiconductor device of claim 1, wherein the trench isolation structure laterally extends through the inner portion.

6. The semiconductor device of claim 1, wherein the trench isolation structure laterally extends from at least the inner portion to at least the outer portion.

7. The semiconductor device of claim 6, wherein the trench isolation structure comprises a plurality of short trenches formed along a straight trench line connecting the inner portion and the outer portion.

8. The semiconductor device of claim 7, wherein the trench isolation structure comprises a plurality of short trenches formed along at least two adjacent straight trench lines, and wherein each of the at least two adjacent straight trench lines at least extends from the inner portion to the outer portion.

9. The semiconductor device of claim 1, wherein the trench isolation structure comprises a continuous trench isolation part at least extending from the inner portion to the outer portion.

10. The semiconductor device of claim 1, wherein the trench isolation structure comprises a continuous, meandering trench isolation part at least extending from the inner portion to the outer portion.

11. The semiconductor device of claim 1, wherein the trench isolation structure comprises a continuous straight trench isolation part at least extending from the inner portion to the outer portion.

12. The semiconductor device of claim 11, wherein the trench isolation structure further comprises at least one transverse trench part running transversely to the continuous straight trench isolation part, and wherein the transverse trench part is formed in the transition portion and in contact with the continuous straight trench isolation part.

13. The semiconductor device of claim 1, wherein the trench isolation structure comprises a pair of continuous straight trench isolation parts at least extending from the inner portion to the outer portion, and at least one transverse trench part running tilted to the continuous straight trench isolation part from a first one to a second one of the pair of continuous straight trench isolation parts.

14. The semiconductor device of claim 1, further comprising:
   an outer trench structure between a first part of the outer portion and a second part of the outer portion,
   wherein the first part includes the second doped region of the first electric element.

15. The semiconductor device of claim 1, wherein the transition portion includes lightly doped extension regions and junction isolation regions laterally separating neighboring ones of the lightly doped extension regions, and wherein the lightly doped extension regions and the junction isolation regions form pn junctions or unipolar junctions.

* * * * *